US009484527B2

United States Patent
Han et al.

(10) Patent No.: US 9,484,527 B2
(45) Date of Patent: Nov. 1, 2016

(54) NANOMETER MAGNETIC MULTILAYER FILM FOR TEMPERATURE SENSOR AND MANUFACTURING METHOD THEREFOR

(71) Applicant: Institute of Physics, Chinese Academy of Sciences, Beijing (CN)

(72) Inventors: Xiufeng Han, Beijing (CN); Zhonghui Yuan, Beijing (CN); Pan Liu, Beijing (CN); Guoqiang Yu, Beijing (CN); Jiafeng Feng, Beijing (CN); Dianlin Zhang, Beijing (CN)

(73) Assignee: INSTITUTE OF PHYSICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 15/046,911

(22) Filed: Feb. 18, 2016

(65) Prior Publication Data

US 2016/0163965 A1 Jun. 9, 2016

Related U.S. Application Data

(63) Continuation of application No. PCT/CN2014/071166, filed on Jan. 23, 2014.

(30) Foreign Application Priority Data

Nov. 1, 2013 (CN) .......................... 2013 1 0534781

(51) Int. Cl.
*H01L 43/08* (2006.01)
*H01L 43/12* (2006.01)
(Continued)

(52) U.S. Cl.
CPC ................. *H01L 43/08* (2013.01); *G01K 7/36* (2013.01); *G01K 7/38* (2013.01); *H01F 10/3272* (2013.01); *H01L 43/02* (2013.01); *H01L 43/12* (2013.01)

(58) Field of Classification Search
CPC ....... H01L 43/02; H01L 43/08; H01L 43/12; H01F 10/3272; G01K 7/36; G01K 7/38
See application file for complete search history.

(56) References Cited

U.S. PATENT DOCUMENTS

| 7,262,941 B2* | 8/2007 | Li ........................... B32B 15/01 257/E43.004 |
| 7,791,845 B2* | 9/2010 | Mauri .................... B82Y 10/00 257/421 |

(Continued)

FOREIGN PATENT DOCUMENTS

| CN | 202582773 | 12/2002 |
| CN | 102270736 | 12/2011 |

(Continued)

OTHER PUBLICATIONS

Institute of Physics, Chinese Academy of Sciences; PCT/CN2014/071166 filed on Jan. 23, 2014; Chinese Version of the International Search Report on Patentability; mailed on Aug. 13, 2014, International Bureau of WIPO; 15 pages.

(Continued)

*Primary Examiner* — Stephen W Smoot
(74) *Attorney, Agent, or Firm* — Peter Su; Dentons US LLP

(57) ABSTRACT

A magnetic multilayer film for a temperature sensor is disclosed. The magnetic multilayer film comprises: a bottom magnetic composite layer provided on a substrate, the bottom magnetic composite layer having a direct pinning structure, an indirect pinning structure, a synthetic ferromagnetic structure, or a synthetic anti-ferromagnetic structure; a spacer layer provided on the bottom magnetic composite layer; and a top magnetic composite layer provided on the spacer layer, the top magnetic composite layer having the direct pinning structure, the indirect pinning structure, the synthetic ferromagnetic structure, or the synthetic anti-ferromagnetic structure, wherein a ferromagnetic layer of the bottom magnetic composite layer closest to the spacer layer has a magnetic moment anti-parallel with that of a ferromagnetic layer of the top magnetic composite layer closest to the spacer layer.

21 Claims, 6 Drawing Sheets

Structure H

(51) Int. Cl.
  *G01K 7/36* (2006.01)
  *H01F 10/32* (2006.01)
  *G01K 7/38* (2006.01)
  *H01L 43/02* (2006.01)

(56) References Cited

U.S. PATENT DOCUMENTS

| | | | | |
|---|---|---|---|---|
| 8,363,462 | B2* | 1/2013 | Nagase | B82Y 25/00 257/421 |
| 8,593,862 | B2* | 11/2013 | Ranjan | B82Y 10/00 257/421 |
| 2008/0258247 | A1* | 10/2008 | Mancoff | G11C 11/16 257/421 |
| 2013/0099780 | A1 | 4/2013 | Ma et al. | |
| 2013/0107616 | A1* | 5/2013 | Ohno | H01L 27/228 365/158 |
| 2013/0236744 | A1* | 9/2013 | Brinkman | G11B 5/3906 428/811.2 |
| 2014/0321199 | A1 | 10/2014 | Han et al. | |

FOREIGN PATENT DOCUMENTS

| | | |
|---|---|---|
| CN | 102487124 | 6/2012 |
| WO | 2009078296 | 6/2009 |

OTHER PUBLICATIONS

English Abstract of Chinese Patent Application No. CN 102270736(A), published on Dec. 7, 2011, Institute of Physics, Chinese Academy of Sciences; 2 pages.

English Abstract of Chinese Patent Application No. CN 102487124(A), published on Jun. 6, 2012, Chinese Acad Physics Inst; 2 pages.

Full English Text Translation of Chinese Patent Application No. CN 202582773(U), published on Dec. 5, 2012, Zhengzhou Fangxing Machinery and Electron Co Ltd; 6 pages.

Full English Text Translation of WO Patent Application No. WO 2009078296(A1), published on Jun. 25, 2009, Alps Electric Co Ltd et al.; 19 pages.

* cited by examiner

Structure A

Structure B

Structure C

Structure D

Structure E

Structure F

Structure G

Structure H

NANOMETER MAGNETIC MULTILAYER FILM FOR TEMPERATURE SENSOR AND MANUFACTURING METHOD THEREFOR

CROSS REFERENCE TO RELATED APPLICATIONS

This application is a continuation application of International Application No. PCT/CN2014/071166, filed on Jan. 23, 2014, which claims priority of Chinese Patent Application No. 201310534781.8, filed on Nov. 1, 2013, the entire disclosures of which are incorporated by reference herein in their entireties.

TECHNICAL FIELD

The present invention relates to a nanometer magnetic multilayer film for a magnetic tunnel junction (MTJ)-based temperature sensor and a method for manufacturing the same.

BACKGROUND

The kernel of the present invention is a magnetic tunnel junction (MTJ) device, which has, as its core part, a sandwich structure including an insulating barrier layer interposed between two ferromagnetic material layers. Under an external magnetic field or by a pinning effect, the two ferromagnetic layers may have their magnetic moments aligned parallel or anti-parallel with each other, and the magnetic tunnel junction has a significantly different resistance in the parallel state than in the anti-parallel state, which is also called as Tunneling MagnetoResistance (TMR) effect. Magnetic tunnel junctions have been applied in magnetic field sensors and magnetic random access memories. In addition, a phenomenon is observed in the magnetic tunnel junctions that its resistance in the anti-parallel state varies linearly with respect to temperature, which can be used to make temperature sensors.

There are many kinds of existing temperature sensors, including thermocouple temperature sensors, thermistor temperature sensors, platinum resistor temperature sensors, semiconductor temperature sensors, and the like. As an important kind of sensors, the temperature sensors have been widely used in personal life and industrial applications. The existing temperature sensors have their own disadvantages. The thermocouple temperature sensor is not easy to be integrated due to its large size and requiring a cold-end temperature compensation circuit. The resistor-type temperature sensor, for example, a platinum resistor temperature sensor, has a self-heating problem, and its cost is relatively high since platinum is a precious metal, so it is used in a relatively narrow range of applications. The thermistor temperature sensor has a poor linearity, relatively low measurement accuracy, and a narrow measurement range.

The TMR temperature sensor, which has an element of magnetic tunnel junction, almost avoids all the disadvantages of other existing temperature sensors (e.g., cold-end compensation, self-heating, low sensitivity, large size, etc.), and meanwhile it combines the following advantages: (1) high accuracy; (2) high stability; (3) high sensitivity; (4) low load, low power consumption, low heat capacity, and high energy efficiency; (5) integrability; (6) mass production ability and low cost; (7) miniaturization; (8) long lifespan; (9) digitalizability; (10) environment friendliness without pollution; and so on. Therefore, it has a very wide range of applications and is more suitable for temperature detecting and monitoring systems of aeronautics and astronautics spacecrafts and detectors, satellites, spacesuits, and space capsules and simulating chambers, for temperature detecting and monitoring systems of terrestrial ships, movable vehicles, and portable personal communication apparatuses, robot systems, industrial automation systems, many types of products such as automobile and civilian products, and the like.

SUMMARY

To overcome the disadvantages of the existing temperature sensors, the present invention provides a nanometer magnetic multilayer film for a magnetic tunnel junction-based temperature sensor and a method for manufacturing the same. The nanometer magnetic multilayer film is divided into three types: a first type is manufactured with a synthetic ferromagnetic or anti-ferromagnetic structure and a pinning structure using a one-time annealing process; a second type is manufactured with two pinning structures using a two-time annealing process; and a third type is manufactured with perpendicular magnetic layers. The three types of structures and different manufacturing processes aim to make the upper and lower ferromagnetic layers of the magnetic tunnel junction in an anti-parallel state, so that resistance of the magnetic tunnel junction can vary linearly with respect to temperature.

The first type of nanometer magnetic multilayer film of the present invention may be implemented by the following technical solution:

A temperature sensor based on the first type of magnetic tunnel junction, in accordance with the present invention, may be a micrometer-scale sensor device formed by implementing a conventional semiconductor manufacture process on the magnetic multilayer film. As shown in FIG. 1, the nanometer magnetic multilayer film includes in sequence from bottom to top:

a substrate 1 with a seed layer (SL) 2 thereon, a bottom magnetic composite layer (BPL) 3, a middle barrier layer (Spacer) 4, a top magnetic composite layer (TPL) 5, and a cap layer (CAP) 6.

Both the bottom magnetic composite layer and the top magnetic composite layer may adopt an indirect pinning structure, a direct pinning structure, a synthetic anti-ferromagnetic structure, or a synthetic ferromagnetic structure. The indirect pinning structure may include an anti-ferromagnetic layer (AFM)/a first ferromagnetic layer (FM1)/a non-magnetic metal layer (NM)/a second ferromagnetic layer (FM2). The direct pinning structure may include an anti-ferromagnetic layer (AFM)/a ferromagnetic layer (FM). The synthetic anti-ferromagnetic structure and the synthetic ferromagnetic structure each may include a first ferromagnetic metal layer (FM1)/a non-magnetic metal layer (NM)/a second ferromagnetic metal layer (FM2), and the first and second ferromagnetic layers may form an anti-ferromagnetic or ferromagnetic coupling depending on thickness of the middle non-magnetic metal layer. The ferromagnetic layers may be made of ferromagnetic materials with high spin polarization, preferably CoFe or CoFeB, with a thickness of 1~10 nm. The metal layer interposed therebetween may be a non-magnetic metal layer NM usually made of Cu, Cr, V, Nb, Mo, Ru, Pd, Ta, W, Pt, Ag, Au or an alloy thereof, with a thickness of 0.05~5 nm. The anti-ferromagnetic layer may be made of IrMn, FeMn, or PtMn, with a thickness of 2~30 nm.

The middle barrier layer may be usually made of materials such as $AlO_x$, MgO, $Mg_{1-x}Al_xO$, AlN, $Ta_2O_5$, ZnO, HfO$_2$, TiO$_2$, Alq$_3$, LB organic composite film, GaAs, AlGaAs, InAs, and the like, preferably MgO, AlO$_x$, MgAlO, AlN, Alq$_3$, and LB organic composite film, with a thickness of 0.5~10 nm.

The cap layer may be made of metal materials which are resistant to oxidization and have a relatively large resistivity, preferably Ta, Ru, Cu, Au, Pt, or the like, with a thickness of 2~10 nm, and it may be used to protect materials therebelow from oxidation.

The seed layer may be made of metal materials having a relatively large resistivity, preferably Ta, Ru, Cr, or Pt, with a thickness of 3~10 nm.

The substrate may be a Si substrate or a Si—SiO$_2$ substrate, with a thickness of 0.3~1 mm.

The present invention provides a method for manufacturing the first type of nanometer magnetic multilayer film comprising steps of:

1) selecting a substrate;
2) depositing, in sequence from bottom to top on the substrate, a bottom layer, a bottom magnetic composite layer, a middle barrier layer, a top magnetic composite layer, and a cap layer;
3) vacuum-annealing the structure resulting from Step 2 under a magnetic field at a temperature higher than Bloch temperatures $T_B$ of anti-ferromagnetic layers included in the top and bottom magnetic composite layers.

Step 2 of the above method may be carried out in three ways. 1. The top magnetic composite layer may adopt an indirect pinning structure including a first ferromagnetic layer (FM1)/a non-magnetic metal layer (NM)/a second ferromagnetic layer (FM2)/an anti-ferromagnetic layer (AFM) deposited in sequence from bottom to top on the middle barrier layer, and the non-magnetic metal layer may have a thickness optimized such that the FM1 and the FM2 form a ferromagnetic coupling therebetween. The bottom magnetic composite layer may also adopt the indirect pinning structure including AFM/FM1/NM/FM2 deposited in sequence from bottom to top on the bottom layer, and a thickness of the NM layer may be adjusted so that the FM1 and the FM2 form an anti-ferromagnetic coupling therebetween. 2. The top magnetic composite layer may adopt a direct pinning structure including a ferromagnetic layer (FM)/an anti-ferromagnetic layer (AFM) deposited in sequence from bottom to top on the middle barrier layer. The bottom magnetic composite layer may adopt an indirect pinning structure including an anti-ferromagnetic layer (AFM)/a first ferromagnetic layer (FM1)/a non-magnetic metal layer (NM)/a second ferromagnetic layer (FM2) deposited in sequence from bottom to top on the bottom layer, and the non-magnetic metal layer NM may have a thickness optimized so that the FM1 and the FM2 form an antiferromagnetic coupling therebetween. 3. The top magnetic composite layer may adopt a synthetic ferromagnetic structure including a first ferromagnetic layer (FM1)/a non-magnetic metal layer (NM)/a second ferromagnetic layer (FM2) deposited in sequence from bottom to top on the middle barrier layer, and the NM layer may have a thickness optimized so that the FM1 and the FM2 form a ferromagnetic coupling therebetween. The bottom magnetic composite layer may adopt a synthetic anti-ferromagnetic structure including FM1/NM/FM2 deposited in sequence from bottom to top on the bottom layer, in which the FM1 and the FM2 form an anti-ferromagnetic coupling therebetween by adjusting thickness of the NM layer. An object of the above is to make magnetic moments of the upper and lower ferromagnetic layers aligned in an anti-parallel state so that, after preparation of a desirable tunnel junction by micro-fabrication processes, resistance of the tunnel junction may vary linearly with respect to the temperature.

The second type of nanometer magnetic multilayer film of the present invention may be implemented by the following technical solution:

A temperature sensor based on the second type of magnetic tunnel junction, in accordance with the present invention, may be a micrometer-scale sensor device formed by applying a conventional semiconductor manufacture process on the magnetic multilayer film. As shown in FIG. 2, the nanometer magnetic multilayer film includes in sequence from bottom to top:

a substrate 1 with a seed layer (SL) 2 thereon, a bottom pinned layer (BPL) 3, a middle barrier layer (Spacer) 4, a top pinned layer (TPL) 5, and a cap layer (CAP) 6.

Both the bottom pinned layer and the top pinned layer may adopt an indirect pinning structure or a direct pinning structure. The indirect pinning structure may include an anti-ferromagnetic layer (AFM)/a non-magnetic metal layer (NM)/a ferromagnetic layer (FM). The direct pinning structure may include an anti-ferromagnetic layer (AFM)/a ferromagnetic layer (FM). The ferromagnetic layer may be made of ferromagnetic materials with high spin polarization, preferably CoFe or CoFeB, with a thickness of 1~10 nm. The metal layer interposed therebetween may be a ultra-thin non-magnetic metal layer NM usually made of Cu, Cr, V, Nb, Mo, Ru, Pd, Ta, W, Pt, Ag, Au or an alloy thereof, with a thickness of 0.05~5 nm. The anti-ferromagnetic layer may be made of IrMn, FeMn, or PtMn, with a thickness of 2~30 nm.

The middle barrier layer may be usually made of materials such as AlO$_x$, MgO, Mg$_{1-x}$Al$_x$O, AlN, Ta$_2$O$_5$, ZnO, HfO$_2$, TiO$_2$, Alq$_3$, LB organic composite film, GaAs, AlGaAs, InAs, and the like, preferably MgO, AlO$_x$, MgAlO, AlN, Alq$_3$, and LB organic composite film, with a thickness of 0.5~10 nm.

The cap layer may be made of metal materials that are resistant to oxidization and have a relatively large resistivity, preferably Ta, Ru, Cu, Au, Pt, and the like, with a thickness of 2~10 nm. The cap layer may be used to protect materials therebelow from oxidation.

The seed layer may be made of metal materials having a relatively large resistivity, preferably Ta, Ru, Cr, and Pt, with a thickness of 3~10 nm.

The substrate may be a Si substrate or a Si—SiO$_2$ substrate, with a thickness of 0.3~1 mm.

The present invention provides a method for manufacturing the second type of nanometer magnetic multilayer film comprising steps of:

1) selecting a substrate;
2) depositing, in sequence from bottom to top on the substrate, a bottom layer, a bottom pinned layer, a middle barrier layer, a top pinned layer, and a cap layer;
3) performing a first vacuum annealing on the structure resulting from Step 2 under a magnetic field at a temperature higher than a blocking temperature $T_{B1}$ of an anti-ferromagnetic layer in the bottom pinned layer (the blocking temperature, also called as Bloch temperature, is a temperature where the FM/AFM exchange biasing effect disappears);
4) performing a second vacuum annealing on the structure resulting from Step 3 under a magnetic field at a temperature lower than the blocking temperature $T_{B1}$ of the anti-ferromagnetic layer in the bottom pinned layer and higher than a blocking temperature $T_{B2}$ of an anti-ferromagnetic layer in the top pinned layer, the magnetic field of the first vacuum annealing being in a direction opposite to that of the second vacuum annealing.

In the above method, growing the bottom pinned layer of Step 2 may include:

depositing, in sequence from bottom to top on the bottom layer, an anti-ferromagnetic layer (AFM)/a non-magnetic metal layer (NM)/a second ferromagnetic layer (FM), or depositing an anti-ferromagnetic layer (AFM)/a ferromagnetic layer (FM).

The third type of nanometer magnetic multilayer film of the present invention may be implemented by the following technical solution:

A temperature sensor based on the perpendicular magnetic tunnel junction, in accordance with the present invention, may be a micrometer-scale sensor device formed by implementing a conventional semiconductor manufacture process on the magnetic multilayer film. The nanometer magnetic multilayer film may include in sequence from bottom to top:

a substrate 1 with a seed layer (SL) thereon, a first bottom magnetic layer (FM1(1)), a bottom non-magnetic metal layer (NM1), a second bottom magnetic layer (FM1(2)), a middle barrier layer (Spacer), a first top magnetic layer (FM2(1)), a top non-magnetic metal layer (NM2), a second top magnetic layer (FM2(2)), and a cap layer (CAP).

The second bottom ferromagnetic layer FM1(2) and the first top ferromagnetic layer FM2(1) may be made of ferromagnetic materials with high spin polarization, preferably Co, CoFe, or CoFeB, with a thickness of 0.4~2 nm which makes magnetic moments thereof perpendicular to the film plane.

The first bottom magnetic layer FM1(1) and the second top magnetic layer FM2(2) may adopt a multilayer structure with perpendicular anisotropy, preferably $[Co/Pt]_n$, $[Co/Pd]_n$, $[Fe/Pt]_n$, and the like, where n may be in a range of 2~30. The first bottom magnetic layer may have a coercivity different from that of the second top magnetic layer, which may be accomplished by using multilayer films of different materials or of different thicknesses in the first bottom magnetic layer than in the second top magnetic layer.

The middle barrier layer may be usually made of materials such as $AlO_x$, MgO, $Mg_{1-x}Al_xO$, AlN, $Ta_2O_5$, ZnO, $HfO_2$, $TiO_2$, $Alq_3$, LB organic composite film, GaAs, AlGaAs, InAs, and the like, preferably MgO, $AlO_x$, MgAlO, AlN, $Alq_3$, and LB organic composite film, with a thickness of 0.5~10 nm.

The cap layer may be made of metal materials that are resistant to oxidization and have a relatively large resistivity, preferably Ta, Ru, Cu, Au, Pt, and the like, with a thickness of 2~10 nm. The cap layer may be used to protect materials therebelow from oxidation.

The seed layer may be made of metal materials having a relatively large resistivity, preferably Ta, Ru, Cr, and Pt, with a thickness of 3~10 nm.

The substrate may be a Si substrate or a Si—$SiO_2$ substrate, with a thickness of 0.3~1 mm.

The present invention provides a method for manufacturing the third type of nanometer magnetic multilayer film comprising steps of:

1) selecting a substrate;
2) depositing, in sequence from bottom to top on the substrate, a bottom layer, a first bottom magnetic layer, a bottom non-magnetic metal layer, a second bottom magnetic layer, a middle barrier layer, a first top magnetic layer, a top non-magnetic metal layer, a second top magnetic layer, and a cap layer;
3) performing a first vacuum annealing on the structure resulting from Step 2 under a magnetic field, the magnetic field being applied in a direction perpendicular to the film plane and having a strength greater than a coercivity $H_{c1}$ of a multilayer structure of the first bottom magnetic layer;
4) performing a second vacuum annealing on the structure resulting from Step 3 under a magnetic field, the magnetic field being applied in a direction perpendicular to the film plane but opposite to the magnetic field applied in the first vacuum annealing and having a strength smaller than the coercivity $H_{C1}$ of the multilayer structure of the first bottom magnetic layer but greater than a coercivity $H_{C2}$ of a multilayer structure of the second top magnetic layer.

The beneficial effects of the present invention include: implementing temperature sensors utilizing the resistance of the magnetic tunnel junction in the anti-parallel state, which have advantages of small size, low power consumption, excellent linearity, and low cost, and thereby it is possible to implement temperature sensors with high accuracy, good integration level, and low power consumption.

DETAILED DESCRIPTION OF THE PREFERRED EMBODIMENT

Figure 1:
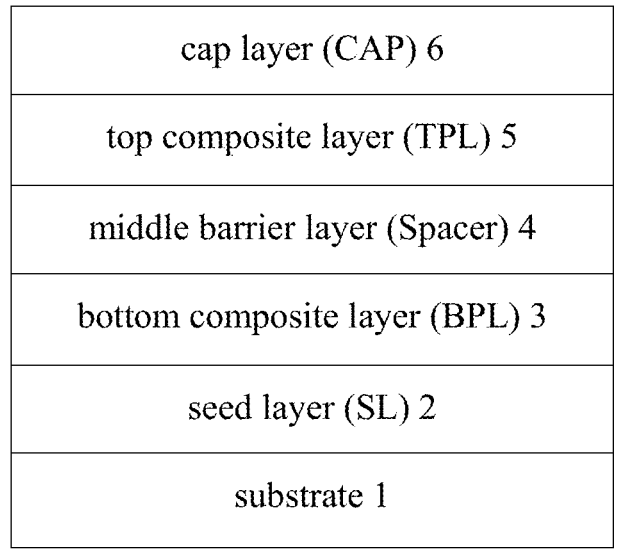
FIG. 1 is a schematic diagram showing structure of a first type of nanometer magnetic multilayer film in accordance with the present invention.

The present invention provides an in-plane nanometer magnetic multilayer film for a temperature sensor and a method for manufacturing the same. The multilayer film has three types of structures. A first type of structure includes, in sequence from bottom to top: a substrate, a bottom layer, a bottom magnetic composite layer, a middle barrier layer, a top magnetic composite layer, and a cap layer, wherein both the top magnetic composite layer and the bottom magnetic composite layer may adopt a direct or indirect pinning structure, a synthetic ferromagnetic or anti-ferromagnetic structure so as to make magnetic moments of the bottom magnetic composite layer and the top magnetic composite layer anti-parallel with each other such that a tunnel junction resistance varies linearly with respect to the temperature. A second type of structure includes, in sequence from bottom to top: a substrate, a bottom layer, a bottom pinned layer, a middle barrier layer, a top pinned layer, and a cap layer, wherein both the top pinned layer and the bottom pinned layer adopt a direct or indirect pinning structure so as to make magnetic moments of the bottom magnetic composite layer and the top magnetic composite layer anti-parallel with each other such that a tunnel junction resistance varies linearly with respect to the temperature. A third type of nanometer magnetic multilayer film structure includes, in sequence from bottom to top: a substrate, a bottom layer, a bottom magnetic multilayer film, a bottom non-magnetic metal layer, a bottom magnetic layer, a middle barrier layer, a top magnetic layer, a top non-magnetic metal layer, a top magnetic multilayer film, and a cap layer, wherein the bottom and top magnetic multilayer films have magnetic moments perpendicular to the film plane, the bottom multilayer film has a coercivity different from that of the top multilayer film, and the top magnetic layer and the bottom magnetic layer have magnetic moments anti-parallel with each other by annealing. A method for manufacturing the nanometer magnetic multilayer film for the temperature sensor of the present invention includes: using a one-time annealing process for the first type of nanometer magnetic multilayer film structure, annealing temperature being higher than blocking temperatures of bottom and top anti-ferromagnetic layers; using a two-time annealing process for the second type of nanometer magnetic multilayer film structure, annealing temperatures being different and magnetic fields being in opposite directions for the two annealing steps so that magnetic moments of the bottom pinned layer and the top pinned layer are in directions anti-parallel with each other in absence of an external magnetic field; using a two-time annealing process for the third type of nanometer magnetic multilayer film structure, the magnetic field applied in the annealing process being perpendicular to the film plane. Magnetic tunnel junction-based temperature sensors having a linear output can be fabricated by using these three types of magnetic multilayer films. The middle barrier layer in the nanometer magnetic multilayer film structures for temperature sensors can be replaced with non-magnetic metal materials, so as to form temperature sensors based on the giant magnetoresistance (GMR) effect.

Disclosures of the following patent applications owned by the applicant are all incorporated herewith as a part of the present application: Chinese Patent Application No. 201110278414.7 entitled "NANOMETER multilayer film, FIELD EFFECT TRANSISTOR, SENSOR, RANDOM ACCESS MEMORY AND METHOD FOR MANUFACTURING THE SAME", Chinese Patent Application No. 201110290855.9 entitled "NANOMETER multilayer film, FIELD EFFECT TRANSISTOR, SENSOR, RANDOM ACCESS MEMORY AND METHOD FOR MANUFACTURING THE SAME", and Chinese Patent Application No. 201110290063.1 entitled "NANOMETER multilayer film, FIELD EFFECT TRANSISTOR, SENSOR, RANDOM ACCESS MEMORY AND METHOD FOR MANUFACTURING THE SAME".

First Embodiment

FIG. 1 shows a nanometer magnetic multilayer film according to an embodiment of the present invention which includes, in sequence from bottom to top: a substrate (SUB for short) 1, a seed layer (SL for short) 2, a bottom magnetic composite layer 3, a middle barrier layer (Spacer for short) 4, a top magnetic composite layer 5, and a cap layer (CAP for short) 6. In some conditions, the top magnetic composite layer 5 has a magnetic moment in a direction anti-parallel with that of the bottom magnetic composite layer 3. The layers each will be described in detail below.

The substrate 1 may be a Si substrate, a SiC substrate, a glass substrate or a Si—$SiO_2$ substrate, a flexible organic substrate, or the like, with a thickness of 0.3~1 mm.

The seed layer (also called as bottom layer) 2 may be a non-magnetic metal layer (including a single layer or multiple layers) which has a good electrical conductivity and is bonded closely to the substrate. Materials for the seed layer may include preferably Ta, Ru, Cr, Au, Ag, Pt, Pd, Cu, CuN, and the like. The seed layer may also be a composite layer of a metal layer and an anti-ferromagnetic layer, with a thickness of 3~50 nm.

The middle barrier layer 4 may be an insulating barrier layer which is usually made of materials such as $AlO_x$, MgO, $Mg_{1-x}Zn_xO$, AlN, $Ta_2O_5$, ZnO, $HfO_2$, $TiO_2$, $Alq_3$, LB organic composite film, GaAs, AlGaAs, InAs, and the like, preferably MgO, $AlO_x$, MgZnO, AlN, $Alq_3$, and LB organic composite film, with a thickness of 0.5~10 nm.

The cap layer 6 may be a metal layer (including a single layer or a multilayer composite metal film) which is resistant to oxidization and has a good electrical conductivity. Materials for the cap layer 6 may include preferably Ta, Cu, Al, Ru, Au, Ag, Pt, and the like. The cap layer 6 may have a thickness of 2~40 nm, and it may be used to protect the core structure therebelow from oxidation and corrosion.

The bottom magnetic composite layer 3 and the top magnetic composite layer 5 may each have a direct pinning structure, an indirect pinning structure, a synthetic ferromagnetic or anti-ferromagnetic structure, or a single ferromagnetic layer. "Direct pinning" means an anti-ferromagnetic layer AFM being in direct contact with a ferromagnetic layer FM (AFM/FM for short) such that the AFM layer directly pins the magnetic moment of the FM layer, and "indirect pinning" means a very thin non-magnetic metal layer NM being interposed between the anti-ferromagnetic layer AFM and the ferromagnetic layer FM (FM/NM/AFM for short) or a composite layer NM/FM being interposed therebetween (FM1/NM/FM2/AFM for short) such that the AFM layer indirectly pins the magnetic moment of the ferromagnetic layer FM or FM1. The pinning effect between AFM and FM (i.e., direct exchange biasing) can be reduced by interposing a middle layer therebetween, and the pinning effect of the indirect exchange biasing can be effectively controlled by adjusting thickness of the middle layer.

In the bottom magnetic composite layer 3 and the top magnetic composite layer 5, the anti-ferromagnetic layer AFM may include an anti-ferromagnetic alloy, preferably PtMn, IrMn, FeMn or NiMn, with a thickness of 3~30 nm; or it may include an anti-ferromagnetic oxide, preferably CoO or NiO, with a thickness of 5~50 nm. The ferromagnetic layer FM may be made of ferromagnetic metals with a high spin polarization, preferably Co, Fe or Ni; or alloy of these ferromagnetic metals, preferably CoFe, CoFeB, NiFeCr or NiFe (e.g., $Ni_{81}Fe_{19}$), with a thickness of 1~20 nm; or diluted magnetic semiconductor materials, such as GaMnAs or GaMnN; or half-metal materials such as CoMnSi, CoFeAl, CoFeSi, CoMnAl, CoFeAlSi, CoMnGe, CoMnGa, CoMnGeGa, $La_{1-x}Sr_xMnO_3$, $La_{1-x}Ca_xMnO_3$ (0<x<1), with a thickness of 2.0~50 nm. The ultra-thin non-magnetic metal layer NM interposed between the ferromagnetic layer FM and the anti-ferromagnetic layer AFM may be usually made of materials such as Cu, Cr, V, Nb, Mo, Ru, Pd, Ta, W, Pt, Ag, Au, or alloy thereof, with a thickness of 0.1~5 nm.

Therefore, examples of the nanometer magnetic multilayer film structure of the present invention may include but not limited to:

Structure A:

SL/AFM1/FM1(1)/NM1/FM1(2)/Spacer/FM2(1)/NM2/FM2(2)/AFM2/CAP. In the nanometer magnetic multilayer film of Structure A, FM1(1)/NM1/FM1(2) can change from anti-ferromagnetic coupling to ferromagnetic coupling as the thickness of NM1 changes, and the coupling strength decreases as the thickness of NM1 increases. Also, FM2(1)/NM2/FM2(2) can change from anti-ferromagnetic coupling to ferromagnetic coupling as the thickness of NM2 changes, and the coupling strength decreases as the thickness of NM2 increases.

Structure B: SL/FM1(1)/NM1/FM1(2)/Spacer/FM2(1)/NM2/FM2(2)/CAP. In the nanometer magnetic multilayer film of Structure B, FM/NM/FM can change from anti-ferromagnetic coupling to ferromagnetic coupling as the thickness of NM changes, and the coupling strength decreases as the thickness of NM increases. In Structure B, magnetic moments of the ferromagnetic layers FM1(2) and FM2(1) on both sides of the middle barrier layer Spacer are set in an anti-parallel state by optimizing thicknesses of the middle non-magnetic metal layers in both the top synthetic anti-ferromagnetic layer and the bottom synthetic anti-ferromagnetic layer.

Structure C: SL/AFM1/FM1/Spacer/FM2(1)/NM2/FM2(2)/AFM2/CAP. In Structure C, FM2(1) and FM2(2) can be made of the same material with different thicknesses.

Structure D: SL/FM1/AFM1/FM2(1)/NM1/FM2(2)/Spacer/FM3/CAP. In the structure, FM2(1) and FM1(2) form an anti-ferromagnetic coupling structure, which is pinned by AFM1.

According to an embodiment of the present invention, a method for manufacturing a nanometer magnetic multilayer film may include steps of:

1) selecting a substrate;

2) depositing, in sequence from bottom to top on the substrate, a bottom layer, a bottom magnetic composite layer, a middle barrier layer, a top magnetic composite layer, and a cap layer;

3) vacuum-annealing the structure resulting from Step 2 in a magnetic field at a temperature higher than a blocking temperature $T_B$ of the anti-ferromagnetic layer(s).

Step 2 of the method may be performed in three ways. 1. The top magnetic composite layer may adopt an indirect pinning structure including a first ferromagnetic layer (FM1)/a non-magnetic metal layer (NM)/a second ferromagnetic layer (FM2)/an anti-ferromagnetic layer (AFM) deposited in sequence from bottom to top on the middle barrier layer, and the thickness of the non-magnetic metal layer NM may be optimized so that ferromagnetic coupling is formed between FM1 and FM2. The bottom magnetic composite layer may adopt the indirect pinning structure including an anti-ferromagnetic layer (AFM)/a first ferromagnetic layer (FM1)/a non-magnetic metal layer (NM)/a second ferromagnetic layer (FM2) deposited in sequence from bottom to top on the bottom layer, and the thickness of the NM layer may be adjusted so that anti-ferromagnetic coupling is formed between FM1 and FM2. 2. The top magnetic composite layer may adopt a direct pinning structure including a ferromagnetic layer (FM)/an anti-ferromagnetic layer (AFM) deposited in sequence from bottom to top on the middle barrier layer. The bottom magnetic composite layer may adopt the indirect pinning structure including an anti-ferromagnetic layer (AFM)/a first ferromagnetic layer (FM1)/a non-magnetic metal layer (NM)/a second ferromagnetic layer (FM2) deposited in sequence from bottom to top on the bottom layer, and the thickness of the non-magnetic metal layer may be optimized so that anti-ferromagnetic coupling is formed between FM1 and FM2. 3. The top magnetic composite layer may adopt a synthetic ferromagnetic structure including a first ferromagnetic layer (FM1)/a non-magnetic metal layer (NM)/a second ferromagnetic layer (FM2) deposited in sequence from bottom to top on the middle barrier layer, and the thickness of the NM layer may be optimized so that ferromagnetic coupling is formed between FM1 and FM2. The bottom magnetic composite layer may adopt a synthetic anti-ferromagnetic structure including a first ferromagnetic layer (FM1)/a non-magnetic metal layer (NM)/a second ferromagnetic layer (FM2) deposited in sequence from bottom to top on the bottom layer, and the thickness of the NM layer may be adjusted so that anti-ferromagnetic coupling is formed between FM1 and FM2. An object of the above is to make the magnetic moment of the upper ferromagnetic layer (the ferromagnetic layer in the top magnetic composite layer closest to the middle barrier layer) anti-parallel with the magnetic moment of the lower ferromagnetic layer (the ferromagnetic layer in the bottom magnetic composite layer closest to the middle barrier layer) so that, after preparation of a desirable tunnel junction by microfabrication processes, resistance of the tunnel junction may vary linearly with respect to the temperature.

Example 1

Figure 2:
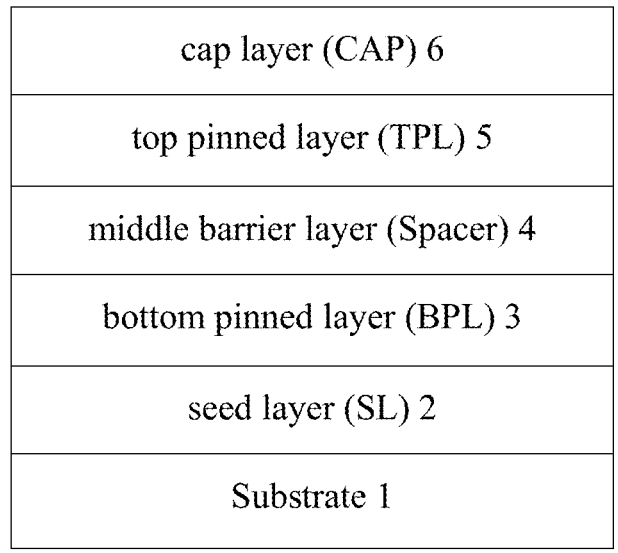
FIG. 2 is a schematic diagram showing structure of a second type of nanometer magnetic multilayer film in accordance with the present invention.

1) A Si—SiO$_2$ substrate with a thickness of 1 mm may be selected as the substrate SUB, and a Ta(5 nm)/Ru(20 nm)/Ta(5 nm) seed layer SL may be deposited on the substrate in a magneto-sputter apparatus at a vacuum degree higher than $2 \times 10^{-6}$ Pa, a deposition rate of 0.1 nm/s, and a depositing Ar pressure of 0.07 Pa;

2) As the first anti-ferromagnetic layer AFM1, IrMn may be deposited to a thickness of 15 nm on the seed layer SL in the magneto-sputter apparatus at a vacuum degree higher than $2 \times 10^{-6}$ Pa, a deposition rate of 0.1 nm/s, and an Ar pressure of 0.07 Pa;

3) As the first bottom ferromagnetic layer FM1(1), CoFeB may be deposited to a thickness of 2.5 nm on the first anti-ferromagnetic layer AFM1 in the magneto-sputter apparatus at a vacuum degree higher than $2 \times 10^{-6}$ Pa, a deposition rate of 0.06 nm/s, and an Ar pressure of 0.07 Pa;

4) As the first non-magnetic metal layer NM1, an ultrathin layer of non-magnetic metal Ru may be deposited to a thickness of 1.5 nm on the first bottom ferromagnetic layer FM1(1) in the magneto-sputter apparatus at a vacuum degree high than $2 \times 10^{-6}$ Pa, a deposition rate of 0.1 nm/s, and an Ar pressure of 0.07 Pa;

5) As the second bottom ferromagnetic layer FM1(2), CoFeB may be deposited to a thickness of 3 nm on the first non-magnetic metal layer in the magneto-sputter apparatus at a vacuum degree higher than $2 \times 10^{-6}$ Pa, a deposition rate of 0.06 nm/s, and an Ar pressure of 0.07 Pa;

6) As the middle barrier layer Spacer, MgO may be deposited to a thickness of 1.0 nm on the second bottom ferromagnetic layer FM1(2) in the magneto-sputter apparatus at a vacuum degree higher than $2 \times 10^{-6}$ Pa, a deposition rate of 0.07 nm/s, and an Ar pressure of 0.07 Pa;

7) As the first top ferromagnetic layer FM2(1), CoFeB may be deposited to a thickness of 3 nm on the middle barrier layer Spacer in the magneto-sputter apparatus at a vacuum degree higher than $2\times10^{-6}$ Pa, a deposition rate of 0.06 nm/s, and an Ar pressure of 0.07 Pa;

8) As the second non-magnetic metal layer NM2, non-magnetic metal Ru may be deposited to a thickness of 1.1 nm on the first top ferromagnetic layer FM2(1) in the magneto-sputter apparatus at a vacuum degree higher than $2\times10^{-6}$ Pa, a deposition rate of 0.1 nm/s, and an Ar pressure of 0.07 Pa;

9) As the second top ferromagnetic layer FM2(2), CoFeB may be deposited to a thickness of 3 nm on the second non-magnetic metal layer NM2 in the magneto-sputter apparatus at a vacuum degree higher than $2\times10^{-6}$ Pa, a deposition rate of 0.06 nm/s, and an Ar pressure of 0.07 Pa;

10) As the second anti-ferromagnetic layer AFM2, IrMn may be deposited to a thickness of 15 nm on the second top ferromagnetic layer FM2(2) in the magneto-sputter apparatus at a vacuum degree higher than $2\times10^{-6}$ Pa, a deposition rate of 0.1 nm/s, and an Ar pressure of 0.07 Pa;

11) As the cap layer CAP, Ta (5 nm)/Ru (5 nm) may be deposited on the second anti-ferromagnetic layer AFM2 in the magneto-sputter apparatus at a vacuum degree higher than $2\times10^{-6}$ Pa, a deposition rate of 0.1 nm/s, and an Ar pressure of 0.07 Pa;

12) The film obtained from Step 11 may be placed under a first magnetic field in a vacuum annealing furnace with a vacuum degree of $2\times10^{4}$ Pa (the first magnetic field is in a direction in the film plane), maintained at a temperature of 265° C. for one hour, and then cooled down, thereby producing a desired nanometer magnetic multilayer film having the structure as shown in FIG. 2.

Then, the nanometer magnetic multilayer film structure may be fabricated by post micro-processing into a solid circular structure with a diameter D=10 μm. The nanometer magnetic multilayer film structure can be used as a core detector unit for a TMR temperature sensor.

Examples 2-6

Figure 3:
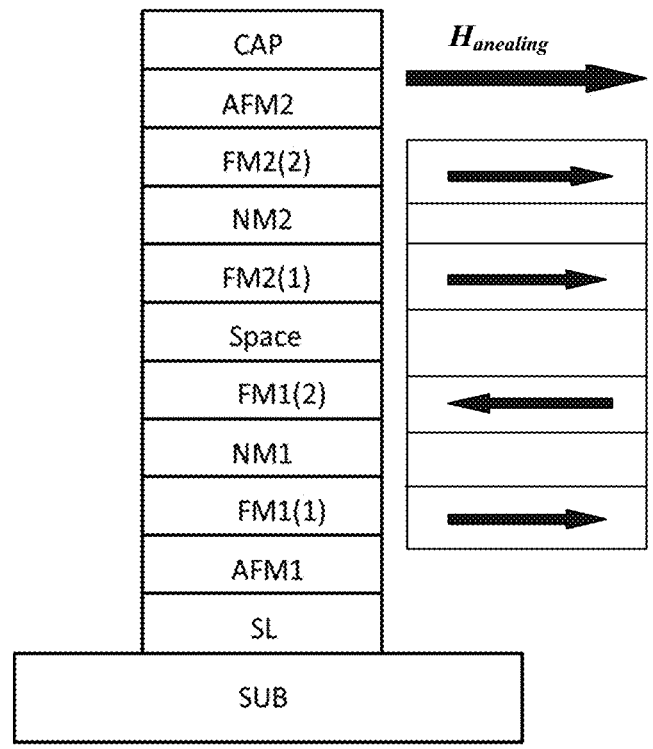
FIG. 3 is a schematic diagram showing a magnetic multilayer film of Structure A and its magnetic moments in accordance with Examples 1-6 of the present invention.

Examples 2-6 may be fabricated in a way similar to Example 1, except that materials of the nanometer magnetic multilayer film of Examples 2-6 are different from those of Example 1. Examples 2-6 have Structure A:

SUB/SL/AFM1/FM1(1)/NM1/FM1(2)/Spacer/FM2(1)/NM2/FM2(2)/AFM2/CAP, as shown in FIG. 3. Composition and thickness of each layer are shown in Table 1 below.

TABLE 1

| Example | | 2 | 3 | 4 | 5 | 6 |
|---|---|---|---|---|---|---|
| SUB | Composition | Si—SiO$_2$ | Si—SiO$_2$ | Si—SiO$_2$ | Si—SiO$_2$ | Si—SiO$_2$ |
|  | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
|  | Thickness | 5/20/5 | 5 | 5/20/5 | 30 | 5/20/5 |
| AFM1 | Composition | PtMn | IrMn | PtMn | PtMn | IrMn |
|  | Thickness | 15 | 15 | 15 | 15 | 15 |
| FM1(1) | Composition | CoFe | CoFe | CoFe | CoFe | CoFe |
|  | Thickness | 3 | 3 | 2.5 | 0.5 | 0.6 |
| NM1 | Composition | Ru | Ru | Ru | Ru | Cu |
|  | Thickness | 0.9 | 0.9 | 1 | 1.1 | 0.5 |
| FM2(1) | Composition | CoFe | Co | CoFeB | CoFe | Co |
|  | Thickness | 3 | 3 | 3 | 4 | 2.5 |
| Spacer | Composition | MgO | AlO$_x$ | MgO | AlO$_x$ | MgZnO |
|  | Thickness | 2.8 nm | 2.0 nm | 1.5 nm | 1.0 nm | 2.0 nm |
| FM2(1) | Composition | CoFe | Co | CoFeB | CoFe | CoFeB |
|  | Thickness | 4.0 nm | 3 | 4.0 nm | 4.0 nm | 3 |
| NM2 | Composition | Ru | Ru | Ru | Ru | Cu |
|  | Thickness | 0.85 | 1.2 | 0.8 | 0.9 | 0.8 |
| FM2(2) | Composition | CoFe | CoFe | CoFe | CoFe | CoFe |
|  | Thickness | 2.5 | 3 | 3.5 | 3.5 | 3 |
| AFM2 | Composition | PtMn | IrMn | IrMn | IrMn | IrMn |
|  | Thickness | 15 | 15 | 15 | 15 | 15 |
| CAP | Composition | Ta/Ru | Cu | Ru | Cu | Ag |
|  | Thickness | 5/5 | 20 | 10 | 20 | 5 |

(In the table, all the thicknesses are in unit of nanometer unless otherwise specified.)

Examples 7-11

Figure 4:
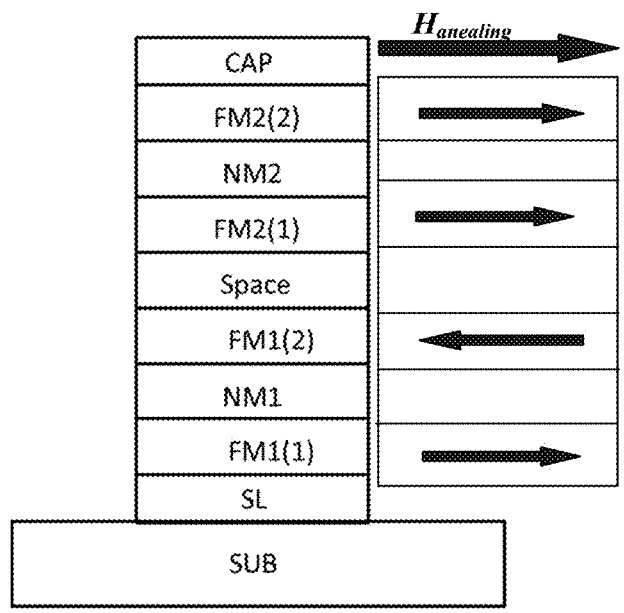
FIG. 4 is a schematic diagram showing a magnetic multilayer film of Structure B and its magnetic moments in accordance with Examples 7-11 of the present invention.

Examples 7-11 may be fabricated in a way similar to Example 1, except that Examples 7-11 may use a one-time annealing process with an annealing temperature of 350° C., and that Examples 7-11 have the nanometer magnetic multilayer film of Structure B:

SUB/SL/FM1(1)/NM1/FM1(2)/Spacer/FM2(1)/NM2/FM2(2)/CAP, as shown in FIG. 4. Composition and thickness of each layer are shown in Table 2 below.

TABLE 2

| Example | | 7 | 8 | 9 | 10 | 11 |
|---|---|---|---|---|---|---|
| SUB | Composition | Si—SiO$_2$ | Si—SiO$_2$ | Si—SiO$_2$ | Si—SiO$_2$ | Si—SiO$_2$ |
|  | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
|  | Thickness | 5/20/5 | 5 | 5/20/5 | 30 | 5/20/5 |
| FM1(1) | Composition | CoFe | CoFe | CoFe | CoFe | CoFe |
|  | Thickness | 3 | 3 | 2.5 | 0.5 | 0.6 |

TABLE 2-continued

| Example | | 7 | 8 | 9 | 10 | 11 |
|---|---|---|---|---|---|---|
| NM1 | Composition | Ru | Ru | Ru | Ru | Cu |
| | Thickness | 0.9 | 0.9 | 1 | 1.1 | 0.5 |
| FM1(2) | Composition | CoFe | Co | CoFeB | CoFe | Co |
| | Thickness | 3 | 3 | 3 | 4 | 2.5 |
| Spacer | Composition | MgO | $AlO_x$ | MgO | $AlO_x$ | MgZnO |
| | Thickness | 2.8 nm | 2.0 nm | 1.5 nm | 1.0 nm | 2.0 nm |
| FM2(1) | Composition | CoFe | Co | CoFeB | CoFe | CoFeB |
| | Thickness | 4.0 nm | 3 | 4.0 nm | 4.0 nm | 3 |
| NM2 | Composition | Ru | Ru | Ru | Ru | Cu |
| | Thickness | 0.85 | 1.2 | 0.8 | 0.9 | 0.8 |
| FM2(2) | Composition | CoFe | CoFe | CoFe | CoFe | CoFe |
| | Thickness | 2.5 | 3 | 3.5 | 3.5 | 3 |
| CAP | Composition | Ta/Ru | Cu | Ru | Cu | Ag |
| | Thickness | 5/5 | 20 | 10 | 20 | 5 |

(In the table, all the thicknesses are in unit of nanometer unless otherwise specified.)

Examples 12-16

Figure 5:
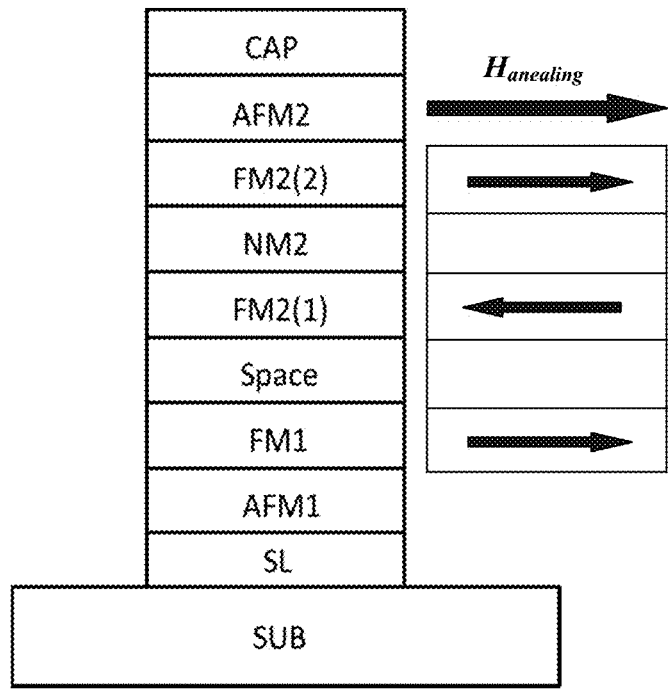
FIG. 5 is a schematic diagram showing a magnetic multilayer film of Structure C and its magnetic moments in accordance with Examples 12-16 of the present invention.

Examples 12-16 may be fabricated in a way similar to Example 1, except that Examples 12-16 have the nanometer magnetic multilayer film of Structure C:
SUB/SL/AFM1/FM1/Space/FM2(1)/NM2/FM2(2)/AFM2/CAP, as shown in FIG. 5. Composition and thickness of each layer are shown in Table 3 below.

TABLE 3

| Example | | 12 | 13 | 14 | 15 | 16 |
|---|---|---|---|---|---|---|
| SUB | Composition | Si—$SiO_2$ | Si—$SiO_2$ | Si—$SiO_2$ | Si—$SiO_2$ | Si—$SiO_2$ |
| | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
| | Thickness | 5/20/5 | 5 | 5/20/5 | 30 | 5/20/5 |
| AFM1 | Composition | PtMn | IrMn | PtMn | PtMn | IrMn |
| | Thickness | 15 | 15 | 15 | 15 | 15 |
| FM1 | Composition | CoFe | Co | CoFeB | CoFe | Co |
| | Thickness | 3 | 10 | 20 | 4 | 2.5 |
| Spacer | Composition | MgO | $AlO_x$ | MgO | $AlO_x$ | MgAlO |
| | Thickness | 2.8 nm | 2.0 nm | 1.5 nm | 1.0 nm | 2.0 nm |
| FM2(1) | Composition | GaMnAs | GaMnN | CoMnSi | $La_{0.5}Ca_{0.5}MO_3$ | CoFeB |
| | Thickness | 4.0 nm | 3 | 2.0 nm | 50 nm | 3 |
| NM2 | Composition | Ru | Ru | Ru | Ru | Cu |
| | Thickness | 0.85 | 1.2 | 0.8 | 0.9 | 0.8 |
| FM2(2) | Composition | CoFe | CoFe | CoFe | CoFe | CoFe |
| | Thickness | 2.5 | 3 | 3.5 | 3.5 | 3 |
| AFM2 | Composition | PtMn | IrMn | IrMn | IrMn | IrMn |
| | Thickness | 15 | 15 | 15 | 15 | 15 |
| CAP | Composition | Ta/Ru | Cu | Ru | Cu | Ag |
| | Thickness | 5/5 | 20 | 10 | 20 | 5 |

(In the table, all the thicknesses are in unit of nanometer unless otherwise specified.)

Example 17

Example 17 may be fabricated in a way similar to Example 1, except that Example 17 has the nanometer magnetic multilayer film of Structure D:
SL/FM1/AFM1/FM2(1)/NM1/FM2(2)/Spacer/FM3/CAP.

Figure 6:
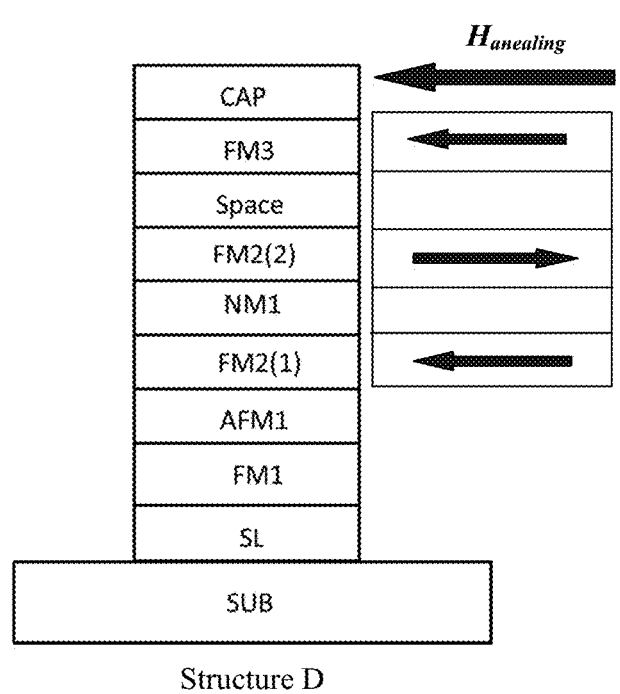
FIG. 6 is a schematic diagram showing a magnetic multilayer film of Structure D and its magnetic moments in accordance with Example 17 of the present invention.

Particular structural components and thicknesses of Example 17 are shown in FIG. 6 and listed below:
Ta(5)/Ru(30)/Ta(5)/$Ni_{81}Fe_{19}$(5)/$Ir_{22}Mn_{78}$(10)/$Co_{90}Fe_{10}$(2.5)/Ru(0.85)/$Co_{40}Fe_{40}B_{20}$(3)/MgO(2.5)/$Co_{40}Fe_{40}B_{20}$(2)/Ta(5)/Ru(5 nm).

Figure 7:
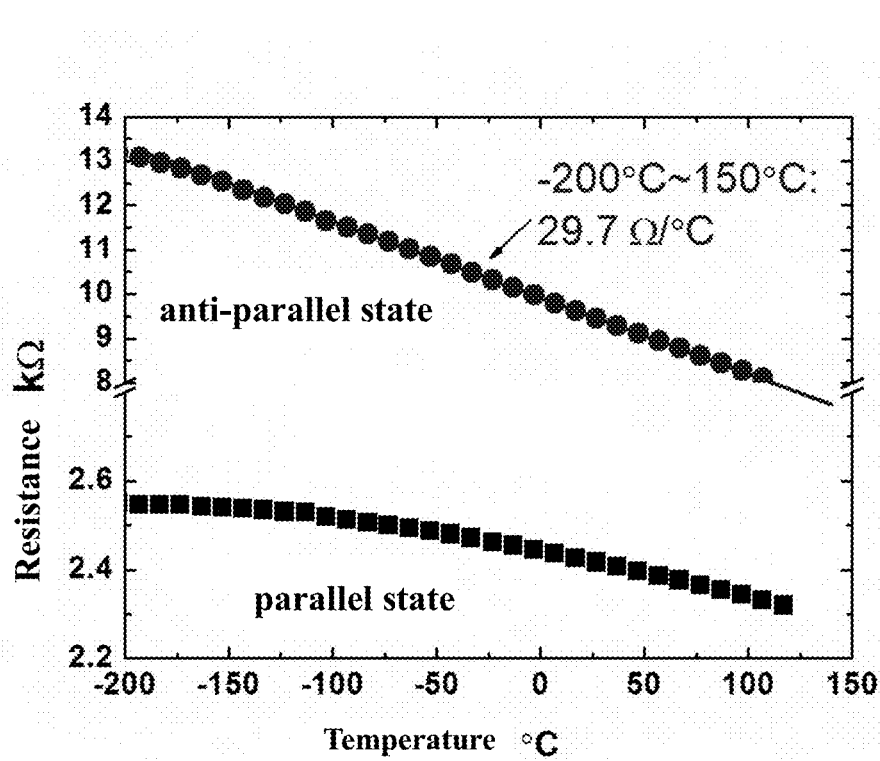
FIG. 7 is a plot diagram showing resistance of a magnetic multilayer film of Structure D as a function of temperature, in accordance with the present invention.

Then the multilayer film structure may be patterned into a micrometer-scale tunnel junction. FIG. 7 shows resistance in the parallel state and resistance in the anti-parallel state of the tunnel junction as a function of temperature. As seen from FIG. 7, the resistance in the anti-parallel state varies linearly with respect to the temperature.

Second Embodiment

FIG. 2 shows a nanometer magnetic multilayer film according to an embodiment of the present invention, which includes, in sequence from bottom to top: a substrate (SUB for short) 1, a seed layer (SL for short) 2, a bottom pinned layer 3, a middle barrier layer (Spacer for short) 4, a top pinned layer 5, and a cap layer (CAP for short) 6. Under a certain condition, the magnetic moment of the top pinned layer 5 (or a ferromagnetic layer in the top pinned layer 5 closest to the middle barrier layer 4) may be anti-parallel with that of the bottom pinned layer 3 (or a ferromagnetic layer in the bottom pinned layer 3 closest to the middle barrier layer 4). Each of the layers will be described in detail below.

The substrate 1 may be a Si substrate, a SiC substrate, a glass substrate, a Si—$SiO_2$ substrate, a flexible organic substrate, or the like, with a thickness of 0.3~1 mm.

The seed layer (also called as bottom layer) 2 may be a non-magnetic metal layer (including a single layer or multiple layers) which has good electrical conductivity and is bonded closely to the substrate. It may include preferably materials such as Ta, Ru, Cr, Au, Ag, Pt, Pd, Cu, CuN, or the like. The seed layer 2 may also be a composite layer including a metal layer and an anti-ferromagnetic layer and have a thickness of 3~50 nm.

The middle barrier layer 4 may be an insulating barrier layer which is usually made of materials such as $AlO_x$, MgO, $Mg_{1-x}Zn_xO$, AlN, $Ta_2O_5$, ZnO, $HfO_2$, $TiO_2$, $Alq_3$, LB organic composite film, GaAs, AlGaAs, InAs, or the like, preferably MgO, $AlO_x$, MgZnO, AlN, $Alq_3$, or LB organic composite film, with a thickness of 0.5~10 nm.

The cap layer 6 may be a metal layer (including a single layer or a multilayer composite metal film) which is resistant to oxidization and has good electrical conductivity. It may include preferably materials such as Ta, Cu, Al, Ru, Au, Ag, Pt, and the like and have a thickness of 2~40 nm. The cap layer 6 may be used to protect the core structure therebelow from oxidation or corrosion.

The bottom pinned layer 3 and the top pinned layer 5 may be of a direct pinning structure or an indirect pinning structure. "Direct pinning" means an anti-ferromagnetic material layer AFM being in direct contact with a ferromagnetic layer FM (AFM/FM for short), and "indirect pinning" means a very thin layer of non-magnetic metal NM being interposed between the anti-ferromagnetic material layer AFM and the ferromagnetic layer FM (FM/NM/AFM for short) or a composite layer NM/FM being interposed therebetween (FM1/NM/FM2/AFM for short). The pinning effect between AFM and FM (i.e., direct exchange biasing) can be reduced by interposing a middle layer therebetween, and the pinning effect of indirect exchange biasing can be effectively controlled by adjusting thickness of the middle layer.

In the bottom pinned layer 3 and the top pinned layer 5, the anti-ferromagnetic layer AFM may include anti-ferromagnetic alloy materials, preferably PtMn, IrMn, FeMn and NiMn, with a thickness of 3~30 nm, or anti-ferromagnetic oxides, preferably CoO and NiO, with a thickness of 5~50 nm. The ferromagnetic layer FM may be made of ferromagnetic metals with high spin polarization, preferably Co, Fe or Ni; or made of a film of alloy of these ferromagnetic metals, preferably ferromagnetic alloys such as CoFe, CoFeB, NiFeCr or NiFe (e.g., $Ni_{81}Fe_{19}$), with a thickness of 1~20 nm; or made of diluted magnetic semiconductor materials, such as GaMnAs or GaMnN; or made of half-metal materials, such as CoMnSi, CoFeAl, CoFeSi, CoMnAl, CoFeAlSi, CoMnGe, CoMnGa, CoMnGeGa, $La_{1-x}Sr_xMnO_3$, $La_{1-x}Ca_xMnO_3$ (0<x<1), with a thickness of 2.0~50 nm. The ultra-thin non-magnetic metal layer NM interposed between the ferromagnetic layer FM and the anti-ferromagnetic layer AFM may be usually made of Cu, Cr, V, Nb, Mo, Ru, Pd, Ta, W, Pt, Ag, Au or an alloy thereof, with a thickness of 0.1~5 nm.

Therefore, examples of the nanometer magnetic multilayer film structure of the present invention may include but not limited to:

Structure E: SL/AFM1/NM1/FM1/Space/FM2/NM2/AFM2/CAP;

Structure F: SL/AFM1/FM1/Space/FM2/NM2/AFM2/CAP;

Structure G: SL/AFM1/FM1/Space/FM2/AFM2/CAP.

The blocking temperature of the top anti-ferromagnetic layer is lower than the blocking temperature of the bottom anti-ferromagnetic layer. That is, if the top anti-ferromagnetic layer and the bottom anti-ferromagnetic layer are made of the same anti-ferromagnetic material, the thickness of the bottom anti-ferromagnetic layer should be larger than that of the top anti-ferromagnetic layer, which will be beneficial to a subsequent magnetic field annealing process. Alternatively, if the top and bottom anti-ferromagnetic layers are made of different anti-ferromagnetic materials, for example, PtMn and IrMn, the blocking temperature of the material for the bottom anti-ferromagnetic layer should be higher than the blocking temperature of the material for the top anti-ferromagnetic layer. The purpose of such optimization is to make the upper and lower ferromagnetic layers on both sides of the middle barrier layer Spacer in an anti-parallel state by the subsequent annealing process, thereby achieving an anti-parallel state resistance that varies linearly with respect to the temperature.

According to an embodiment of the present invention, a method for manufacturing a nanometer magnetic multilayer film may include steps of:

1) selecting a substrate 1, and depositing a bottom layer 2, a bottom pinned layer 3, a middle barrier layer 4, a top pinned layer 5 and a cap layer 6 in this order on the substrate using a conventional process such as magneto-sputtering, pulsed laser deposition, and the like;

2) performing a first annealing process on the structure obtained from Step 1 under a magnetic field at a temperature $T_1$ higher than the blocking temperature $T_{B1}$ of a anti-ferromagnetic layer included in the bottom pinned layer;

3) performing a second annealing process on the structure obtained from Step 2 under a magnetic field at a temperature $T_2$ between the blocking temperature $T_{B1}$ of the anti-ferromagnetic layer included in the bottom pinned layer and the blocking temperature $T_{B2}$ of the anti-ferromagnetic layer included in the top pinned layer, the magnetic field of the first annealing being in a direction opposite to that of the second annealing.

Examples of the method for manufacturing the nanometer magnetic multilayer film according to the above-mentioned embodiments of the present invention will be given below.

Example 18

1) A Si—$SiO_2$ substrate with a thickness of 1 mm may be selected as the substrate SUB, and then Ta (5 nm)/Ru (20 nm)/Ta (5 nm), as the seed layer SL, may be deposited on the substrate in a magneto-sputter apparatus at a vacuum degree higher than $2\times10^{-6}$ Pa, a deposition rate of 0.1 nm/s, and an depositing Ar pressure of 0.07 Pa;

2) As the first anti-ferromagnetic layer AFM1, IrMn may be deposited to a thickness of 15 nm on the seed layer SL in the magneto-sputter apparatus at a vacuum degree higher than $2\times10^{-6}$ Pa, a deposition rate of 0.1 nm/s, and an Ar pressure of 0.07 Pa;

3) As the first non-magnetic metal layer NM1, an ultra-thin layer of non-magnetic metal Ru may be deposited to a thickness of 0.08 nm on the first anti-ferromagnetic layer AFM1 in the magneto-sputter apparatus at a vacuum degree higher than $2\times10^{-6}$ Pa, a deposition rate of 0.1 nm/s, and an Ar pressure of 0.07 Pa;

4) As the first ferromagnetic layer FM1, CoFeB may be deposited to a thickness of 2.5 nm on the first non-magnetic metal layer NM1 in the magneto-sputter apparatus at a vacuum degree higher than $2\times10^{-6}$ Pa, a deposition rate of 0.06 nm/s, and an Ar pressure of 0.07 Pa;

5) As the middle barrier layer Spacer, MgO may be deposited to a thickness of 1.0 nm on the first ferromagnetic layer FM1 in the magneto-sputter apparatus at a vacuum degree higher than $2\times10^{-6}$ Pa, a deposition rate of 0.07 nm/s, and an Ar pressure of 0.07 Pa;

6) As the second ferromagnetic layer FM2, CoFeB may be deposited to a thickness of 3 nm on the middle barrier layer Spacer in the magneto-sputter apparatus at a vacuum degree higher than $2\times10^{-6}$ Pa, a deposition rate of 0.06 nm/s, and an Ar pressure of 0.07 Pa;

7) As the second non-magnetic metal layer NM2, an ultra-thin layer of non-magnetic metal Ru may be deposited to a thickness of 0.04 nm on the second ferromagnetic layer FM2 in the magneto-sputter apparatus at a vacuum degree higher than $2\times10^{-6}$ Pa, a deposition rate of 0.1 nm/s, and an Ar pressure of 0.07 Pa;

8) As the second anti-ferromagnetic layer AFM2, IrMn may be deposited to a thickness of 6.5 nm on the second non-magnetic metal layer NM2 in the magneto-sputter apparatus at a vacuum degree higher than $2\times10^{-6}$ Pa, a deposition rate of 0.1 nm/s, and an Ar pressure of 0.07 Pa;

9) As the cap layer CAP, Ta (5 nm)/Ru (5 nm) may be deposited on the second anti-ferromagnetic layer AFM2 in the magneto-sputter apparatus at a vacuum degree higher than $2\times10^{-6}$ Pa, a deposition rate of 0.1 nm/s, and an Ar pressure of 0.07 Pa;

10) The film obtained from Step 9 may be placed under a first magnetic field in a vacuum annealing furnace with a vacuum degree of $2\times10^{-4}$ Pa (the first magnetic field is in a certain direction in the film plane), maintained in the vacuum annealing furnace at a temperature of 265° C. for one hour, and then cooled down;

11) The film obtained from Step 10 may be placed under a second magnetic field in the vacuum annealing furnace with a vacuum degree of $2\times10^{-4}$ Pa (the second magnetic field is still in the film plane but opposite to the first magnetic field), maintained in the vacuum annealing furnace at a temperature of 200° C. for 15 minutes, and then cooled down, thereby producing the desired nanometer magnetic multilayer film having the structure shown in FIG. 7.

Then, the nanometer magnetic multilayer film structure may be fabricated by post micro-processing into a solid circular structure with a diameter D=10 μm. The nanometer magnetic multilayer film structure can be used as a core detector unit of a TMR temperature sensor.

Examples 19-23

Examples 19-23 may be fabricated in a way similar to Example 18, except that composition and thickness of respective layers (as shown in Table 4 below) are different from those of Example 18, and annealing temperatures of the two-time annealing process are determined appropriately according to the blocking temperatures of two anti-ferromagnetic layers for the bottom pinned layer and the top pinned layer.

Figure 8:
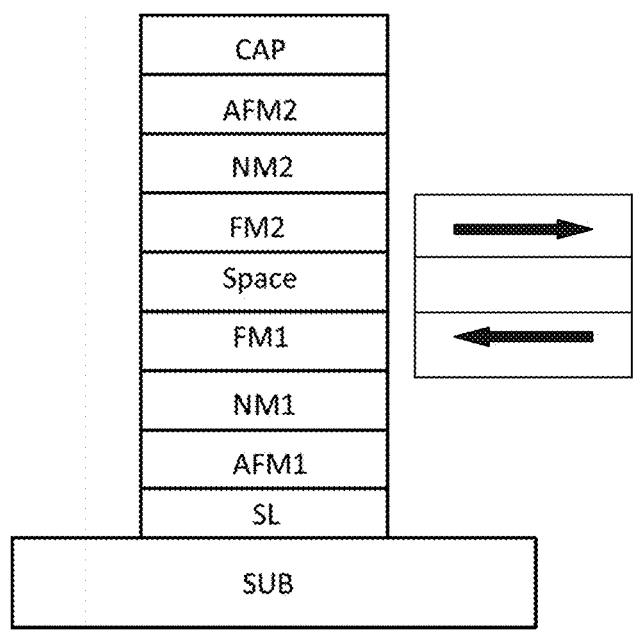
FIG. 8 is a schematic diagram showing a magnetic multilayer film of Structure E and its magnetic moments in accordance with Examples 18-23 of the present invention.

Examples 19-23 have a nanometer magnetic multilayer film of Structure E:

SUB/SL/AFM1/NM1/FM1/Spacer/FM2/NM2/AFM2/CAP, as shown in FIG. 8.

Composition and thickness of each layer are shown in Table 4 below.

TABLE 4

| | Example | 19 | 20 | 21 | 22 | 23 |
|---|---|---|---|---|---|---|
| SUB | Composition | Si—SiO$_2$ | Si—SiO$_2$ | Si—SiO$_2$ | Si—SiO$_2$ | Si—SiO$_2$ |
| | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
| | Thickness | 5/20/5 | 5 | 5/20/5 | 30 | 5/20/5 |
| AFM1 | Composition | PtMn | IrMn | PtMn | PtMn | IrMn |
| | Thickness | 15 | 15 | 15 | 15 | 15 |
| NM1 | Composition | Cu | Ru | Ru | Ru | Cu |
| | Thickness | 0.5 | 0.2 | 1 | 1.1 | 0.5 |
| FM1 | Composition | CoFe | Co | CoFeB | CoFe | Co |
| | Thickness | 3 | 3 | 3 | 4 | 2.5 |
| Spacer | Composition | MgO | AlO$_x$ | MgO | AlO$_x$ | MgAlO |
| | Thickness | 2.8 nm | 2.0 nm | 1.5 nm | 1.0 nm | 2.0 nm |
| FM2 | Composition | CoFe | Co | CoFeB | CoFe | CoFeB |
| | Thickness | 4.0 nm | 3 | 4.0 nm | 4.0 nm | 3 |
| NM2 | Composition | Ru | Ru | Ru | Ru | Cu |
| | Thickness | 0.85 | 1.2 | 0.8 | 0.9 | 0.8 |
| AFM2 | Composition | PtMn | IrMn | IrMn | IrMn | IrMn |
| | Thickness | 7 | 7 | 12 | 12 | 7 |
| CAP | Composition | Ta/Ru | Cu | Ru | Cu | Ag |
| | Thickness | 5/5 | 20 | 10 | 20 | 5 |

(In the table, all the thicknesses are in unit of nanometer unless otherwise specified.)

Examples 24-28

Figure 9:
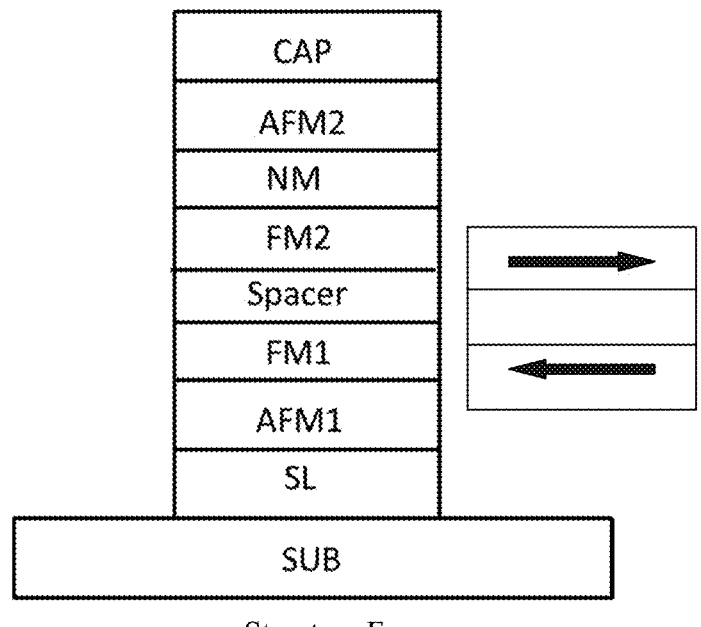
FIG. 9 is a schematic diagram showing a magnetic multilayer film of Structure F and its magnetic moments in accordance with Examples 24-28 of the present invention.

Examples 24-28 may be fabricated in a way similar to Example 18, except that Examples 24-28 have a nanometer magnetic multilayer film of Structure F:

SUB/SL/AFM1/FM1/Spacer/FM2/NM/AFM2/CAP, as shown in FIG. 9. Composition and thickness of each layer are shown in Table 5 below.

TABLE 5

| | Example | 24 | 25 | 26 | 27 | 28 |
|---|---|---|---|---|---|---|
| SUB | Composition | Si—SiO$_2$ | Si—SiO$_2$ | Si—SiO$_2$ | Si—SiO$_2$ | Si—SiO$_2$ |
| | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
| | Thickness | 5/20/5 | 5 | 10/30/10 | 30 | 5/20/5 |
| AFM1 | Composition | PtMn | IrMn | PtMn | CoO | IrMn |
| | Thickness | 5 | 15 | 30 | 10 | 15 |
| FM1 | Composition | CoFe | Co | CoFeB | CoFe | Co |
| | Thickness | 3 | 3 | 3 | 4 | 2.5 |

TABLE 5-continued

| Example | | 24 | 25 | 26 | 27 | 28 |
|---|---|---|---|---|---|---|
| Spacer | Composition | $AlO_x$ | MgO | MgO | $AlO_x$ | MgAlO |
| | Thickness | 1.0 nm | 2.0 nm | 1.5 nm | 0.5 nm | 2.0 nm |
| FM2 | Composition | CoFe | Co | CoFeB | CoFe | CoFeB |
| | Thickness | 4.0 nm | 3 | 4.0 nm | 4.0 nm | 3 |
| NM | Composition | Ru | Ta | Cr | Ru | Cu |
| | Thickness | 0.85 | 5 | 3 | 0.9 | 0.8 |
| AFM2 | Composition | PtMn | IrMn | IrMn | CoO | IrMn |
| | Thickness | 7 | 7 | 12 | 5 | 7 |
| CAP | Composition | Ta/Ru | Cu | Ru | Cu | Ag |
| | Thickness | 5/5 | 40 | 10 | 20 | 2 |

(In the table, all the thicknesses are in unit of nanometer unless otherwise specified.)

Examples 29-33

Figure 10:
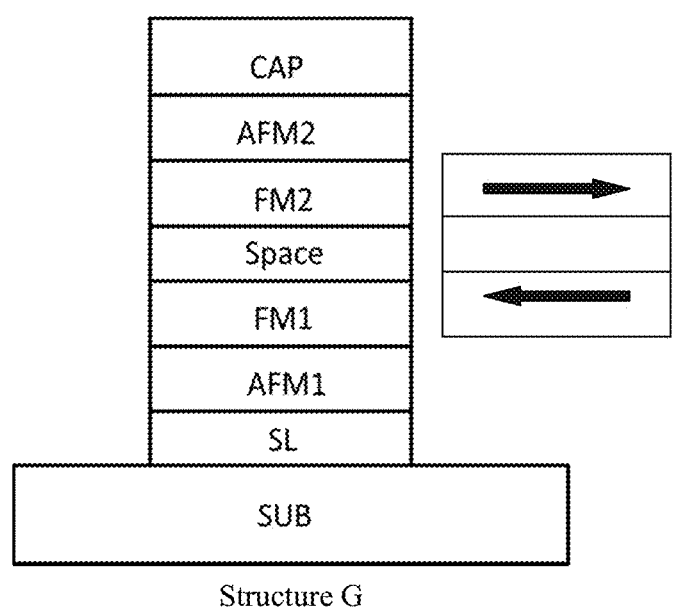
FIG. 10 is a schematic diagram showing a magnetic multilayer film of Structure G and its magnetic moments in accordance with Examples 29-33 of the present invention.

Examples 29-33 may be fabricated in a way similar to Example 18, except that Examples 29-33 have a nanometer magnetic multilayer film of Structure G:

SUB/SL/AFM1/FM1/Spacer/FM2/AFM2/CAP, as shown in FIG. 10. Composition and thickness of each layer are shown in Table 6 below.

TABLE 6

| Example | | 29 | 30 | 31 | 32 | 33 |
|---|---|---|---|---|---|---|
| SUB | Composition | Si—$SiO_2$ | Si—$SiO_2$ | Si—$SiO_2$ | Si—$SiO_2$ | Si—$SiO_2$ |
| | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
| | Thickness | 5/20/5 | 5 | 5/20/5 | 30 | 5/20/5 |
| AFM1 | Composition | PtMn | IrMn | PtMn | PtMn | IrMn |
| | Thickness | 15 | 15 | 15 | 15 | 15 |
| FM1 | Composition | CoFe | Co | CoFeB | CoFe | Co |
| | Thickness | 3 | 3 | 3 | 4 | 2.5 |
| Spacer | Composition | MgO | $AlO_x$ | MgO | $AlO_x$ | MgAlO |
| | Thickness | 2.8 nm | 2.0 nm | 1.5 nm | 1.0 nm | 2.0 nm |
| FM2 | Composition | CoFe | Co | CoFeB | CoFe | CoFeB |
| | Thickness | 4.0 nm | 3 | 4.0 nm | 4.0 nm | 3 |
| AFM2 | Composition | PtMn | IrMn | IrMn | IrMn | IrMn |
| | Thickness | 7 | 7 | 12 | 12 | 7 |
| CAP | Composition | Ta/Ru | Cu | Ru | Cu | Ag |
| | Thickness | 5/5 | 20 | 10 | 20 | 5 |

(In the table, all the thicknesses are in unit of nanometer unless otherwise specified.)

Third Embodiment

Figure 11:
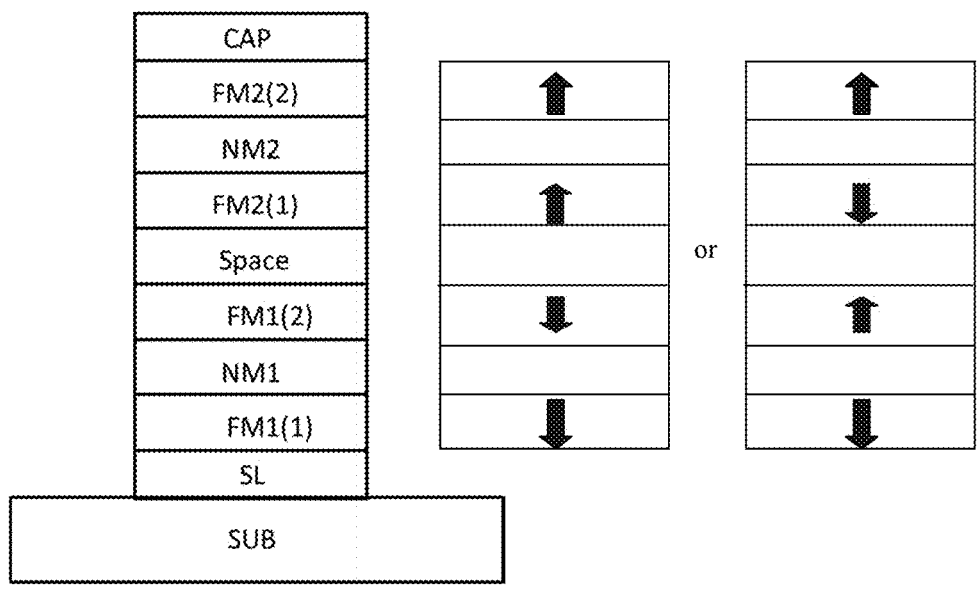
FIG. 11 is a schematic diagram showing a magnetic multilayer film of Structure H and its magnetic moments in accordance with Examples 34-39 of the present invention.

FIG. 11 shows a nanometer magnetic multilayer film according to a third embodiment of the present invention with a structure of SL/FM1(1)/NM1/FM1(2)/Spacer/FM2(1)/NM2/FM2(2)/CAP, which includes, in sequence from bottom to top: a substrate (SUB for short) 1, a seed layer (SL for short), a first bottom ferromagnetic layer (FM1(1)), a bottom non-magnetic metal layer (NM1), a second bottom ferromagnetic layer (FM1(2)), a middle barrier layer (Spacer), a first top ferromagnetic layer (FM2(1)), a top non-magnetic metal layer (NM2), a second top ferromagnetic layer (FM2(2)), and a cap layer (CAP for short). The two ferromagnetic layers may form a ferromagnetic coupling or an anti-ferromagnetic coupling therebetween by adjusting thickness of the non-magnetic metal layer. In the third embodiment of the present application, the two ferromagnetic layers and the magnetic multilayer film may have magnetic moments perpendicular to the film plane by optimizing materials, thicknesses, and growth conditions thereof. Each of the layers will be described in detail below.

The substrate 1 may be a Si substrate, a SiC substrate, a glass substrate, a Si—$SiO_2$ substrate, a flexible organic substrate, or the like, with a thickness of 0.3~1 mm.

The seed layer (also called as bottom layer) 2 may be a non-magnetic metal layer (including a single layer or multiple layers) which has a good electrical conductivity and is bonded closely to the substrate. Materials for the seed layer may include preferably Ta, Ru, Cr, Au, Ag, Pt, Pd, Cu, CuN, and the like, and the seed layer may have a thickness of 3~50 nm.

The middle barrier layer 4 may be an insulating barrier layer which is usually made of materials such as $AlO_x$, MgO, $Mg_{1-x}Zn_xO$, AlN, $Ta_2O_5$, ZnO, $HfO_2$, $TiO_2$, $Alq_3$, LB organic composite film, GaAs, AlGaAs, InAs, and the like, preferably MgO, $AlO_x$, MgZnO, AlN, $Alq_3$, or LB organic composite film, with a thickness of 0.5~10 nm.

The cap layer 6 may be a metal layer (including a single-layer or multilayer composite metal film) which is resistant to oxidization and has good electrical conductivity. The cap layer 6 may preferably include materials such as Ta, Cu, Al, Ru, Au, Ag, Pt, and the like, with a thickness of 2~40 nm to protect the core structure therebelow from oxidation or corrosion.

The second bottom feromagnetic layer FM1(2) and the first top ferromagnetic layer FM2(1) may have a structure of a single magnetic layer made of materials preferably Co, Fe, CoFeB, CoFe, and the like, with a thickness of 0.4~2 nm to ensure that magnetic moments of the two ferromagnetic layers are perpendicular to the film plane.

The bottom non-magnetic metal layer NM1 and the top non-magnetic metal layer NM2 may be made of metal materials preferably Cu, Ru, Ag, and the like, with a thickness of 0~1 nm. A ferromagnetic coupling or an anti-ferromagnetic coupling may be formed between the two ferromagnetic layers at both sides of the non-magnetic metal layer depending on the thickness thereof.

The first bottom ferromagnetic layer FM1(1) and the second top ferromagnetic layer FM2(2) may each adopt a multilayer film structure with perpendicular anisotropy, preferably a perpendicular magnetic multilayer film of [Co (0.01-2 nm)/Pt(0.01-2 nm)]$_n$, [Co(0.01-2 nm)/Pd(0.01-2 nm)]$_n$, [Co(0.01-2 nm)/Ni(0.01-2 nm)]$_n$, [Fe(0.01-2 nm)/Pt (0.1-2 nm)]$_n$, [CoFe(0.01-2 nm)/Pd(0.01~2 nm)]$_n$, and the like, where n may be in a range of 2~20. The bottom magnetic multilayer film FM1(1) may have coercivity larger than that of the top magnetic multilayer film FM2(2), and the coercivity difference may be achieved by using multilayer films of different materials or thicknesses for the bottom and top magnetic multilayer films FM1(1) and FM2(2).

The present invention provides a method for manufacturing the above-mentioned nanometer magnetic multilayer film comprising steps of:

1) selecting a substrate;
2) depositing, in sequence from bottom to top on the substrate, a bottom layer, a first bottom ferromagnetic layer, a bottom non-magnetic metal layer, a second bottom ferromagnetic layer, a middle barrier layer, a first top ferromagnetic layer, a top non-magnetic metal layer, a second top ferromagnetic layer, and a cap layer;
3) performing a first vacuum annealing on the structure resulting from Step 2 under a first magnetic field, the first magnetic field being applied in a direction perpendicular to the film plane and having a strength larger than coercivity $H_{c1}$ of the first bottom ferromagnetic layer;
4) performing a second vacuum annealing on the structure resulting from Step 3 under a second magnetic field, the second magnetic field being applied in a direction perpendicular to the film plane but opposite to the first magnetic field applied in the first vacuum annealing and having a strength lower than the coercivity $H_{c1}$ of the first bottom ferromagnetic layer but larger than coercivity $H_{c2}$ of the second top ferromagnetic layer.

Because the first bottom ferromagnetic layer FM1(1) and the second top ferromagnetic layer FM2(2) have different coercivities, and the two bottom magnetic layers (FM1(1) and FM1(2)) and the two top magnetic layers (FM2(1) and FM2(2)) can respectively form ferromagnetic and anti-ferromagnetic coupling, the first top ferromagnetic layer and second bottom ferromagnetic layer may have magnetic moments anti-parallel with each other after the two-time annealing process.

Examples of manufacturing a nanometer magnetic multilayer film according to the manufacturing method of the above-mentioned embodiment of the present application are given below.

Example 34

1) A Si—SiO$_2$ substrate with a thickness of 1 mm may be selected as the substrate SUB, and then Ta (5 nm)/Ru (20 nm)/Ta (5 nm), as the seed layer SL, may be deposited on the substrate in a magneto-sputter apparatus at a vacuum degree higher than 2×10$^{-6}$ Pa, a deposition rate of 0.1 nm/s, and an depositing Ar pressure of 0.07 Pa;
2) In the magneto-sputter apparatus, a Pt layer of 0.8 nm and then a Co layer of 0.2 nm may be deposited on the seed layer SL at a vacuum degree higher than 2×10$^{-6}$ Pa, a deposition rate of 0.059 nm/s, and an Ar pressure of 0.073 Pa, and the deposition repeats six times, thereby forming a first bottom magnetic multilayer film [Co/Pt]$_6$ as the first bottom ferromagnetic layer FM1(1);
3) As the NM1 layer, an ultra-thin layer of non-magnetic metal Ru may be deposited to a thickness of 1.5 nm on the first bottom ferromagnetic layer FM1(1) in the magneto-sputter apparatus at a vacuum degree higher than 2×10$^{-6}$ Pa, a deposition rate of 0.1 nm/s, and an Ar pressure of 0.07 Pa;
4) As the second bottom ferromagnetic layer FM1(2), a CoFeB layer may be deposited to a thickness of 1.0 nm on the NM1 layer in the magneto-sputter apparatus at a vacuum degree higher than 2×10$^{-6}$ Pa, a deposition rate of 0.06 nm/s, and an Ar pressure of 0.07 Pa;
5) As the middle barrier layer Spacer, a MgO layer may be deposited to a thickness of 1.2 nm on the second bottom ferromagnetic layer FM1(2) in the magneto-sputter apparatus at a vacuum degree higher than 2×10$^{-6}$ Pa, a deposition rate of 0.07 nm/s, and an Ar pressure of 0.07 Pa;
6) As the first top ferromagnetic layer FM2(1), a CoFeB layer may be deposited to a thickness of 1.5 nm on the middle barrier layer Spacer in the magneto-sputter apparatus at a vacuum degree higher than 2×10$^{-6}$ Pa, a deposition rate of 0.06 nm/s, and an Ar pressure of 0.07 Pa;
7) As the NM2 layer, an ultra-thin layer of non-magnetic metal Ru may be deposited to a thickness of 1.5 nm on the first top ferromagnetic layer FM2(1) in the magneto-sputter apparatus at a vacuum degree higher than 2×10$^{-6}$ Pa, a deposition rate of 0.1 nm/s, and an Ar pressure of 0.07 Pa;
8) In the magneto-sputter apparatus, a Co layer of 0.6 nm and then a Ni layer of 0.2 nm may be deposited on the NM2 layer at a vacuum degree higher than 2×10$^{-6}$ Pa, a deposition rate of 0.059 nm/s, and an Ar pressure of 0.073 Pa, and the deposition repeats four times, thereby forming the second top magnetic multilayer film [Co/Ni]$_4$ as the second top ferromagnetic layer FM2(2);
9) The film resulting from Step 8 may be firstly annealed in a vacuum annealing furnace with a vacuum degree of 2×10$^4$ Pa under a first magnetic field (perpendicular to the film plane) larger than the coercivity $H_{c1}$ of the first bottom ferromagnetic layer FM1(1) at a temperature of 350° C. for one hour, and then cooled down;
10) The film resulting from Step 9 may be secondly annealed in the vacuum annealing furnace with a vacuum degree of 2×10$^4$ Pa under a second magnetic field (perpendicular to the film plane but opposite to the first magnetic field in the first annealing) larger than the coercivity $H_{c2}$ of the second top ferromagnetic layer but smaller than the coercivity $H_{c2}$ of the first bottom ferromagnetic layer at a temperature of 350° C. for one hour, and then cooled down.

The nanometer magnetic multilayer film structure is then fabricated by post micro-processing into a solid circular structure with a diameter D=10 μm. The nanometer magnetic multilayer film structure can be used as a core detector unit of a TMR temperature sensor.

Examples 35~39

Examples 35~39 may be fabricated in a way similar to Example 34 except thickness and material of each layer, as shown in Table 7.

TABLE 7

| | Example | 35 | 36 | 37 | 38 | 39 |
|---|---|---|---|---|---|---|
| SUB | Composition | Si—SiO$_2$ | Si—SiO$_2$ | Si—SiO$_2$ | Si—SiO$_2$ | Si—SiO$_2$ |
| | Thickness | 1 mm | 1 mm | 1 mm | 1 mm | 1 mm |
| SL | Composition | Ta/Ru/Ta | Ru | Ru/Cu/Ru | Ta | Ta/Ru/Ta |
| | Thickness | 5/20/5 | 5 | 5/20/5 | 30 | 5/20/5 |

TABLE 7-continued

| Example | | 35 | 36 | 37 | 38 | 39 |
|---|---|---|---|---|---|---|
| FM1(1) | Composition | Pt(5)/[Co(0.6)/Pt(1.8)]$_4$/Co(0.6) | Pt(5)/[Co(0.6)/Pt(1.8)]$_4$/Co(0.6) | Pt(1.8)/[Fe(0.2)/Pt(1.8)]$_4$/Fe(0.2) | Pt(1.8)/[Co(0.7)/Pt(1.8)]$_4$/Co(0.7) | Pd(1.6)/[Co(0.4)/Pd(1.6)]$_4$/Co(0.4) |
| NM1 | Composition | Ru | Ru | Ru | Ru | Cu |
| | Thickness | 0.85 | 1.2 | 0.8 | 0.9 | 0.8 |
| FM1(2) | Composition | CoFe | Co | CoFeB | CoFe | Co |
| | Thickness | 3 | 3 | 3 | 4 | 2.5 |
| Spacer | Composition | MgO | AlO$_x$ | MgO | AlO$_x$ | MgAlO |
| | Thickness | 2.8 nm | 2.0 nm | 1.5 nm | 1.0 nm | 2.0 nm |
| FM2(1) | Composition | CoFe | Co | CoFeB | CoFe | CoFeB |
| | Thickness | 4.0 nm | 3 | 4.0 nm | 4.0 nm | 3 |
| NM2 | Composition | Ru | Ru | Ru | Ru | Cu |
| | Thickness | 0.85 | 1.2 | 0.8 | 0.9 | 0.8 |
| FM2(2) | Composition | [Co(0.1)/Ni(0.2)]$_{20}$ | [Co$_{90}$Fe$_{10}$(0.2)/Pd(1.2)]$_3$ | [Co$_{90}$Fe$_{10}$(0.2)/Pd(1.2)]$_3$ | [Co(0.6)/Pt(1.8)]4/Pt(2) | [Co$_{90}$Fe$_{10}$(0.2)/Pd(1.2)]$_3$ |
| CAP | Composition | Ta/Ru | Cu | Ru | Cu | Ag |
| | Thickness | 5/5 | 20 | 10 | 20 | 5 |

(In the table, all the thicknesses are in unit of nanometer unless otherwise specified.)

The nanometer magnetic multilayer film structure is then fabricated into a solid circular structure with a diameter D=10 μm by post micro-processing. The nanometer magnetic multilayer film structure can be used as a core detector unit of a TMR temperature sensor.

INDUSTRIAL APPLICABILITY

The temperature sensor may be implemented utilizing resistance of a magnetic tunnel junction in an anti-parallel state, which has many advantages such as small size, low power consumption, excellent linearity, low cost, high accuracy, high integration level, and low power consumption.

Apparently, the present invention has also various other embodiments. It should be understood that those skilled in the art can make various modifications and variations without departing from the spirits and principles of the present invention, and such modifications and variations all fall within the scope of the claims of the present application.

We claim:

1. A magnetic multilayer film for a temperature sensor comprising:
   a bottom magnetic composite layer disposed on a substrate, the bottom magnetic composite layer having a direct pinning structure, an indirect pinning structure, a synthetic ferromagnetic structure, or a synthetic anti-ferromagnetic structure;
   a spacer layer disposed on the bottom magnetic composite layer; and
   a top magnetic composite layer disposed on the spacer layer, the top magnetic composite layer having the direct pinning structure, the indirect pinning structure, the synthetic ferromagnetic structure, or the synthetic anti-ferromagnetic structure,
   wherein a ferromagnetic layer of the bottom magnetic composite layer closest to the spacer layer has a magnetic moment anti-parallel with that of a ferromagnetic layer of the top magnetic composite layer closest to the spacer layer.

2. The magnetic multilayer film of claim 1 wherein the direct pinning structure comprises an anti-ferromagnetic layer and a ferromagnetic layer in contact with each other, the indirect pinning structure comprises a first indirect pinning structure including an anti-ferromagnetic layer, a non-magnetic metal layer in contact with the anti-ferromagnetic layer, and a ferromagnetic layer in contact with the non-magnetic metal layer, or a second indirect pinning structure including an anti-ferromagnetic layer, a first ferromagnetic layer in contact with the anti-ferromagnetic layer, a non-magnetic metal layer in contact with the first ferromagnetic layer, and a second ferromagnetic layer in contact with the non-magnetic metal layer,
   the synthetic ferromagnetic structure comprises a first ferromagnetic layer and a second ferromagnetic layer with a non-magnetic metal layer interposed therebetween, the non-magnetic metal layer having a thickness to induce ferromagnetic coupling between the first and second ferromagnetic layers, and
   the synthetic anti-ferromagnetic structure comprises a first ferromagnetic layer and a second ferromagnetic layer with a non-magnetic metal layer interposed therebetween, the non-magnetic metal layer having a thickness to induce anti-ferromagnetic coupling between the first and second ferromagnetic layers.

3. The magnetic multilayer film of claim 2 wherein the bottom magnetic composite layer and the top magnetic composite layer both have the second indirect pinning structure, the non-magnetic metal layer of the bottom magnetic composite layer having a thickness to induce ferromagnetic coupling and anti-ferromagnetic coupling between the first and second ferromagnetic layers on either side thereof, and the non-magnetic metal layer of the top magnetic composite layer having a thickness to induce the other one of ferromagnetic coupling and anti-ferromagnetic coupling between the first and second ferromagnetic layers on either side thereof.

4. The magnetic multilayer film of claim 2 wherein one of the bottom and top magnetic composite layers has the synthetic ferromagnetic structure, and the other of the bottom and top magnetic composite layers has the synthetic anti-ferromagnetic structure.

5. The magnetic multilayer film of claim 2 wherein one of the bottom and top magnetic composite layers has the synthetic ferromagnetic structure, and the other of the bottom and top magnetic composite layers has the second indirect pinning structure, the non-magnetic metal layer of the second indirect pinning structure having a thickness to induce an anti-ferromagnetic coupling between the first and second ferromagnetic layers on either side thereof.

6. The magnetic multilayer film of claim 2 wherein one of the bottom and top magnetic composite layers has the synthetic anti-ferromagnetic structure, and the other of the bottom and top magnetic composite layers has the second indirect pinning structure, the non-magnetic metal layer of the second indirect pinning structure having a thickness to induce a ferromagnetic coupling between the first and second ferromagnetic layers on either side thereof.

7. The magnetic multilayer film of claim 2 wherein one of the bottom and top magnetic composite layers has the direct pinning structure, and the other of the bottom and top magnetic composite layers has the synthetic anti-ferromagnetic structure or the second indirect pinning structure, the non-magnetic metal layer of the second indirect pinning structure having a thickness to induce an anti-ferromagnetic coupling between the first and second ferromagnetic layers on either side thereof.

8. The magnetic multilayer film of claim 2 wherein the bottom magnetic composite layer has the direct pinning structure or the indirect pinning structure, and the top magnetic composite layer has the direct pinning structure or the indirect pinning structure, the anti-ferromagnetic layer of the bottom magnetic composite layer having a blocking temperature different from that of the anti-ferromagnetic layer of the top magnetic composite layer.

9. The magnetic multilayer film of claim 2 wherein the bottom magnetic composite layer has the synthetic ferromagnetic or anti-ferromagnetic structure, and the top magnetic composite layer has the synthetic ferromagnetic or anti-ferromagnetic structure, the ferromagnetic layer of the bottom magnetic composite layer farther from the spacer layer having a coercivity different from that of the ferromagnetic layer of the top magnetic composite layer farther from the spacer layer.

10. The magnetic multilayer film of claim 9 wherein the bottom and top magnetic composite layers both have a perpendicular magnetic moment.

11. The magnetic multilayer film of claim 9 wherein the ferromagnetic layer of the bottom magnetic composite layer farther from the spacer layer and the ferromagnetic layer of the top magnetic composite layer farther from the spacer layer each comprise a magnetic multilayer having a perpendicular magnetic moment.

12. The magnetic multilayer film of claim 1 wherein the spacer layer is made of a non-magnetic insulating material or a non-magnetic metal material.

13. A method for manufacturing a magnetic multilayer film for a temperature sensor comprising:
   depositing a bottom magnetic composite layer on a substrate, the bottom magnetic composite layer having a direct pinning structure, an indirect pinning structure, a synthetic ferromagnetic structure, or a synthetic anti-ferromagnetic structure;
   depositing a spacer layer on the bottom magnetic composite layer;
   depositing a top magnetic composite layer on the spacer layer, the top magnetic composite layer having the direct pinning structure, the indirect pinning structure, the synthetic ferromagnetic structure, or the synthetic anti-ferromagnetic structure; and
   performing a magnetic field vacuum annealing on the resulting structure such that a ferromagnetic layer of the bottom magnetic composite layer closest to the spacer layer has a magnetic moment anti-parallel with that of a ferromagnetic layer of the top magnetic composite layer closest to the spacer layer.

14. The method of claim 13 wherein the direct pinning structure comprises an anti-ferromagnetic layer and a ferromagnetic layer in contact with each other,
   the indirect pinning structure comprises a first indirect pinning structure including an anti-ferromagnetic layer, a non-magnetic metal layer in contact with the anti-ferromagnetic layer, and a ferromagnetic layer in contact with the non-magnetic metal layer, or a second indirect pinning structure including an anti-ferromagnetic layer, a first ferromagnetic layer in contact with the anti-ferromagnetic layer, a non-magnetic metal layer in contact with the first ferromagnetic layer, and a second ferromagnetic layer in contact with the non-magnetic metal layer,
   the synthetic ferromagnetic structure comprises a first ferromagnetic layer and a second ferromagnetic layer with a non-magnetic metal layer interposed therebetween, the non-magnetic metal layer having a thickness to induce ferromagnetic coupling between the first and second ferromagnetic layers, and
   the synthetic anti-ferromagnetic structure comprises a first ferromagnetic layer and a second ferromagnetic layer with a non-magnetic metal layer interposed therebetween, the non-magnetic metal layer having a thickness to induce anti-ferromagnetic coupling between the first and second ferromagnetic layers.

15. The method of claim 14 wherein depositing the bottom magnetic composite layer comprises depositing the bottom magnetic composite layer of the second indirect pinning structure, and depositing the top magnetic composite layer comprises depositing the top magnetic composite layer of the second indirect pinning structure, the non-magnetic metal layer of the bottom magnetic composite layer being deposited to a thickness to induce one of ferromagnetic coupling and anti-ferromagnetic coupling between the first and second ferromagnetic layers on either side thereof, the non-magnetic metal layer of the top magnetic composite layer being deposited to a thickness to induce the other one of ferromagnetic coupling and anti-ferromagnetic coupling between the first and second ferromagnetic layers on either side thereof.

16. The method of claim 14 wherein one of the bottom and top magnetic composite layers is deposited to have the synthetic ferromagnetic structure, and the other of the bottom and top magnetic composite layers is deposited to have the synthetic anti-ferromagnetic structure.

17. The method of claim 14 wherein one of the bottom and top magnetic composite layers is deposited to have the synthetic ferromagnetic structure, and the other of the bottom and top magnetic composite layers is deposited to have the second indirect pinning structure, the non-magnetic metal layer of the second indirect pinning structure being deposited to have a thickness to induce anti-ferromagnetic coupling between the first and second ferromagnetic layers on either side thereof.

18. The method of claim 14 wherein one of the bottom and top magnetic composite layers is deposited to have the synthetic anti-ferromagnetic structure, and the other of the bottom and top magnetic composite layers is deposited to have the second indirect pinning structure, the non-magnetic metal layer of the second indirect pinning structure being deposited to a thickness to induce ferromagnetic coupling between the first and second ferromagnetic layers on either side thereof.

19. The method of claim 14 wherein one of the bottom and top magnetic composite layers is deposited to have the direct pinning structure, and the other of the bottom and top magnetic composite layers is deposited to have the synthetic anti-ferromagnetic structure or the second indirect pinning structure, the non-magnetic metal layer of the second indirect pinning structure being deposited to a thickness to induce an anti-ferromagnetic coupling between the first and second ferromagnetic layers on either side thereof.

20. A method for manufacturing a magnetic multilayer film for a temperature sensor comprising:
    depositing a first bottom magnetic layer, a bottom non-magnetic metal layer, a second bottom magnetic layer, a middle barrier layer, a first top magnetic layer, a top non-magnetic metal layer, and a second top magnetic layer in this order on a substrate;
    performing a first vacuum annealing on the resulting structure with a first magnetic field perpendicular to the film plane, the first magnetic field being larger than coercivity of any of the first bottom magnetic layer and the second top magnetic layer; and
    performing a second vacuum annealing on the resulting structure with a second magnetic field opposite to the first magnetic field, the second magnetic field being larger than coercivity of one of the first bottom magnetic layer and the second top magnetic layer and smaller than coercivity of the other of the first bottom magnetic layer and the second top magnetic layer.

21. The method of claim 20 wherein the first bottom magnetic layer, the second bottom magnetic layer, the first top magnetic layer, and the second top magnetic layer each have a perpendicular magnetic moment, the first bottom magnetic layer and the second top magnetic layer each including a multilayer of $[A/B]_n$, where A represents a magnetic metal, B represents a non-magnetic metal, and n is an integer between 2 and 30.

* * * * *